US008421305B2

(12) United States Patent
Harvey et al.

(10) Patent No.: US 8,421,305 B2
(45) Date of Patent: Apr. 16, 2013

(54) MEMS DEVICES AND SYSTEMS ACTUATED BY AN ENERGY FIELD

(75) Inventors: Ian R. Harvey, Kaysville, UT (US); Taylor M. Meacham, Salt Lake City, UT (US); Ronald W. Boutte, Layton, UT (US); Brian Baker, Salt Lake City, UT (US); Iain E. Harvey, Kaysville, UT (US)

(73) Assignee: The University of Utah Research Foundation, Salt Lake City, UT (US)

( * ) Notice: Subject to any disclaimer, the term of this patent is extended or adjusted under 35 U.S.C. 154(b) by 458 days.

(21) Appl. No.: 12/596,091

(22) PCT Filed: Apr. 17, 2008

(86) PCT No.: PCT/US2008/060608
§ 371 (c)(1),
(2), (4) Date: Apr. 6, 2010

(87) PCT Pub. No.: WO2008/131088
PCT Pub. Date: Oct. 30, 2008

(65) Prior Publication Data
US 2010/0194237 A1   Aug. 5, 2010

Related U.S. Application Data

(60) Provisional application No. 60/923,813, filed on Apr. 17, 2007.

(51) Int. Cl.
*H02N 1/00* (2006.01)
(52) U.S. Cl.
USPC ............................................ 310/309; 335/78

(58) Field of Classification Search ................. 310/309; 335/78
See application file for complete search history.

(56) References Cited

U.S. PATENT DOCUMENTS

| | | | | |
|---|---|---|---|---|
| 3,401,294 | A * | 9/1968 | Cricchi et al. | 313/392 |
| 6,456,420 | B1 * | 9/2002 | Goodwin-Johansson | 359/291 |
| 6,583,374 | B2 * | 6/2003 | Knieser et al. | 200/181 |
| 6,798,312 | B1 * | 9/2004 | Harris et al. | 333/24.2 |
| 7,023,124 | B2 * | 4/2006 | Akagawa | 310/309 |
| 7,053,520 | B2 * | 5/2006 | Zetti et al. | 310/309 |
| 2002/0072201 | A1 * | 6/2002 | Potter | 438/455 |
| 2002/0101170 | A1 * | 8/2002 | Dunphy et al. | 315/169.3 |

(Continued)

OTHER PUBLICATIONS

Zhou, T., et al., "MEMS 3D Optical Mirror/Scanner", Proceedings of the International Conference on MEMS, NANO and Smart Systems, 2003.

(Continued)

*Primary Examiner* — Tran N. Nguyen
*Assistant Examiner* — Alex W Mok
(74) *Attorney, Agent, or Firm* — Foley & Lardner LLP

(57) ABSTRACT

A microelectromechanical system (MEMS) device includes an actuator having a plurality of charge collection elements. At least one of the charge collection elements is configured to build up electrical charges by directly interacting with an energy field thereby actuating the MEMS through Coulombic interactions. An actuator for a MEMS device is configured to actuate the MEMS device through Coulombic interactions by pumping charges to the actuator when subject to an energy field. A method of actuating a MEMS device includes irradiating an actuator of the MEMS device with an energy field thereby building up electrical charges on the actuator, and actuating the MEMS device with Coulomb forces from the built up electrical charges.

20 Claims, 32 Drawing Sheets

U.S. PATENT DOCUMENTS

| | | | |
|---|---|---|---|
| 2002/0182091 A1* | 12/2002 | Potter | 417/413.3 |
| 2003/0080476 A1* | 5/2003 | Barton et al. | 264/603 |
| 2004/0027029 A1* | 2/2004 | Borwick et al. | 310/309 |
| 2004/0056742 A1* | 3/2004 | Dabbaj | 335/78 |
| 2004/0246306 A1* | 12/2004 | Adams et al. | 347/54 |
| 2005/0146241 A1* | 7/2005 | Wan | 310/309 |
| 2005/0185251 A1* | 8/2005 | Shreeve et al. | 359/291 |
| 2006/0017533 A1* | 1/2006 | Jahnes et al. | 335/78 |
| 2006/0024928 A1* | 2/2006 | Seebauer et al. | 438/514 |
| 2006/0066934 A1 | 3/2006 | Selbrede | |
| 2006/0071578 A1* | 4/2006 | Drabe et al. | 310/309 |
| 2006/0164710 A1* | 7/2006 | Fujii et al. | 359/224 |
| 2006/0267593 A1* | 11/2006 | Ichimura et al. | 324/452 |
| 2006/0289804 A1* | 12/2006 | Knippelmeyer et al. | 250/492.22 |
| 2007/0057522 A1* | 3/2007 | Keller | 294/65.5 |
| 2007/0069605 A1* | 3/2007 | Klaasse et al. | 310/309 |
| 2007/0080647 A1* | 4/2007 | Desieres et al. | 315/169.3 |
| 2007/0247018 A1* | 10/2007 | Flores et al. | 310/309 |

OTHER PUBLICATIONS

Liu, Z., et al., "Novel Electrostatic Repulsion Forces in MEMS Applications by Nonvolatile Charge Injection", IEEE, 2002, pp. 598-601.

International Preliminary Report on Patentability for PCT/US2008/060608 mailed Oct. 20, 2009.

\* cited by examiner

MEMS DEVICES AND SYSTEMS ACTUATED BY AN ENERGY FIELD

CROSS-REFERENCE TO RELATED APPLICATIONS

The present application is a U.S. national stage application claiming the benefit of International Application No. PCT/US2008/060608, filed on Apr. 17, 2008, which claims the benefit of U.S. Provisional Application No. 60/923,813, filed on Apr. 17, 2007, the disclosures of which are incorporated herein by reference in their entireties.

BACKGROUND OF THE INVENTION

1. Field of the Invention

This invention relates generally to microelectromechanical system (MEMS) devices. More specifically, the invention relates to actuating mechanisms for MEMS devices.

2. Description of Related Art

Many MEMS elements, devices, and systems are being developed. The MEMS structures, with typical dimensions ranging from a few microns to a millimeter, find a wide range of applications in, for example, variable capacitors, inductors, switches, sensors, gyroscopes, mirror devices, drug delivery devices, etc. Silicon is a widely used material for MEMS because of its superior mechanical properties, mature processing technologies, and ease of integration with silicon-based electronic circuitry. Polymers and metals are also used for MEMS elements.

An actuating mechanism is an essential component of a MEMS device. Conventional MEMS actuators are powered by electrical current generated by, for example, an electrical power source. The electrical current is directed to the MEMS actuators by an electrical current conduit composed of conductive materials such as metal or doped silicon. MEMS devices are actuated by the electrical current through electrostatic, piezoelectric, or resistive heating effects. In these conventional MEMS devices, a voltage or current power source is coupled to the actuator typically by directly placing lead lines or probes onto the actuator to cause dynamic actuation thereto.

BRIEF SUMMARY OF THE INVENTION

In one aspect, the invention provides a microelectromechanical systems (MEMS) device, including an actuator having a plurality of charge collection elements. At least one of the charge collection elements is configured to build up electrical charges by directly interacting with an energy field thereby actuating the MEMS device through Coulombic interactions.

In one embodiment, the energy field interacts with the actuator through free space propagation.

The energy field may include at least one of an electron beam, a laser beam, a radiation beam, a charged particle beam, an uncharged particle beam, a photon beam, a static charge from triboelectric effect, and a discharge of a capacitor. In one embodiment, the energy field includes an electron beam from a scanning electron microscope (SEM), and the electron beam causes electrical charges to build up on the at least one charge collection element.

In one embodiment, a first and a second of the plurality of charge collection elements are configured to have repulsive Coulombic interactions therebetween when interacting with the energy field. The actuator may further include a third charge collection element configured to have attractive Coulombic interactions with at least one of the first and the second charge collection elements.

The MEMS device may further include a substrate, and a first and second charge collection elements of the plurality of charge collection elements are electrically isolated from the substrate. The second charge collection element may be configured to charge positively when interacting with the energy field. In one embodiment, the second charge collection element has at least one of a dimension, a density, a coating, and a topography selected such that a relative excess of secondary electrons is produced relative to an electrical node, and the second charge collection element acts as a secondary-electron emitter. The first charge collection element may also be a secondary-electron emitter such that the first charge collection element and the second charge collection element have repulsive Coulombic interactions therebetween when subject to the energy field. The first and second charge collection elements may have a common node.

In one embodiment, the actuator further includes a third charge collection element configured to have attractive Coulombic interactions with at least one of the first and second charge collection elements.

In another embodiment, the first charge collection element has at least one of a dimension, a density, a coating, and a topography selected such that a relative excess of secondary electrons is produced relative to an electrical node, and the first charge collection element acts as a primary electron trap such that the first charge collection element and the second charge collection element have attractive Coulombic interactions therebetween when subject to the energy field.

The actuator may further include a spring configured to provide a biasing or restoring force when at least one of the charge collection elements is grounded or shorted.

In one embodiment, at least two of the plurality of charge collection members of the MEMS device have comb structures configured to increase an area of the Coulombic interactions therebetween.

In another aspect, the invention provides an actuator for a MEMS device. The actuator includes a plurality of charge collection elements configured to actuate the MEMS device through Coulombic interactions by pumping charges to the actuator when subject to an energy field. In one embodiment, the energy field comprises an electron beam. The Coulombic interactions may include at least one of a repulsive interaction and an attractive interaction.

In another aspect, the invention provides a method of actuating a MEMS device. The method includes irradiating an actuator of the MEMS device with an energy field thereby building up electrical charges on the actuator, and actuating the MEMS device with Coulomb forces from the built up electrical charges. In one embodiment, the energy field is irradiated onto the actuator through free space propagation. Actuating the MEMS device with Coulomb forces may include actuating the MEMS device with a combination of repulsive and attractive Coulombic interactions.

DETAILED DESCRIPTION

Figure 1:
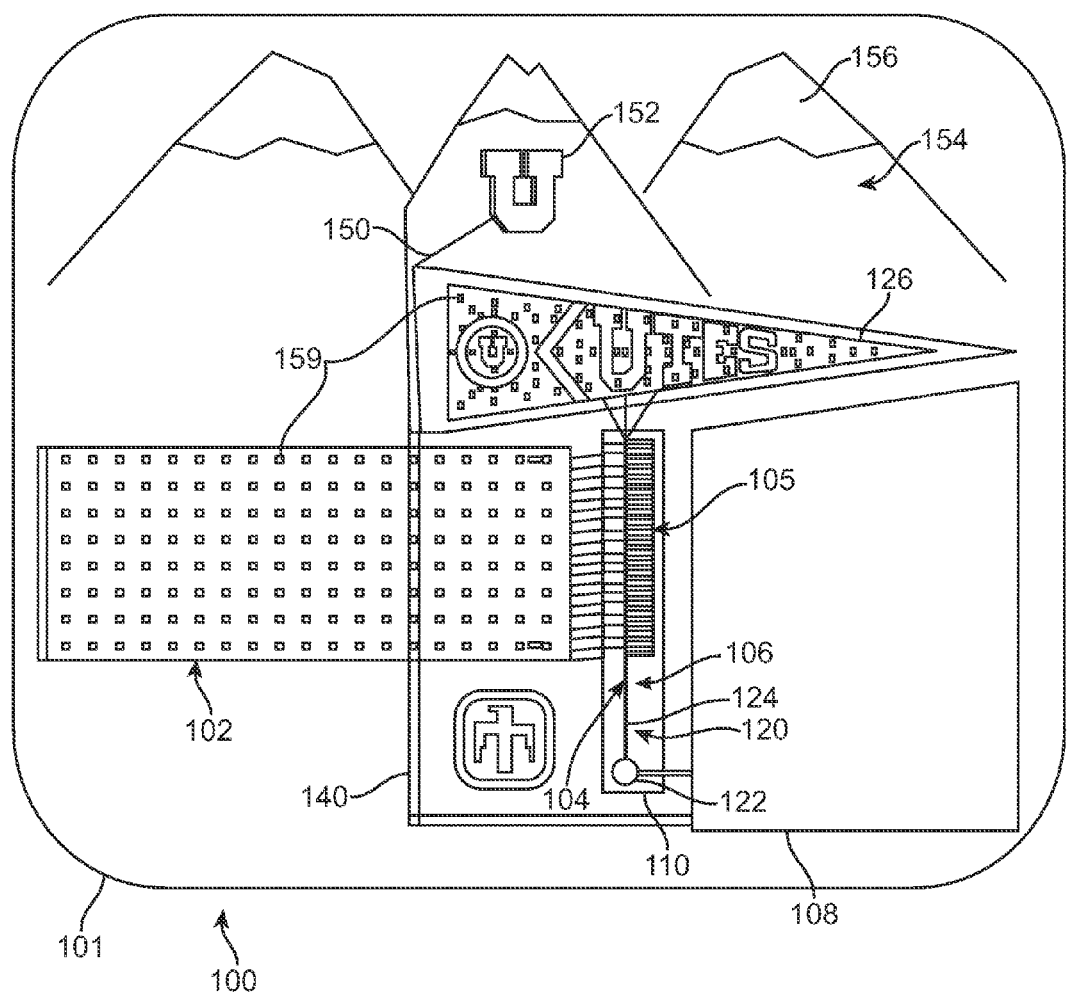
FIG. 1 is a top plan view of a MEMS device in accordance with an embodiment of the invention.
Figure 2:
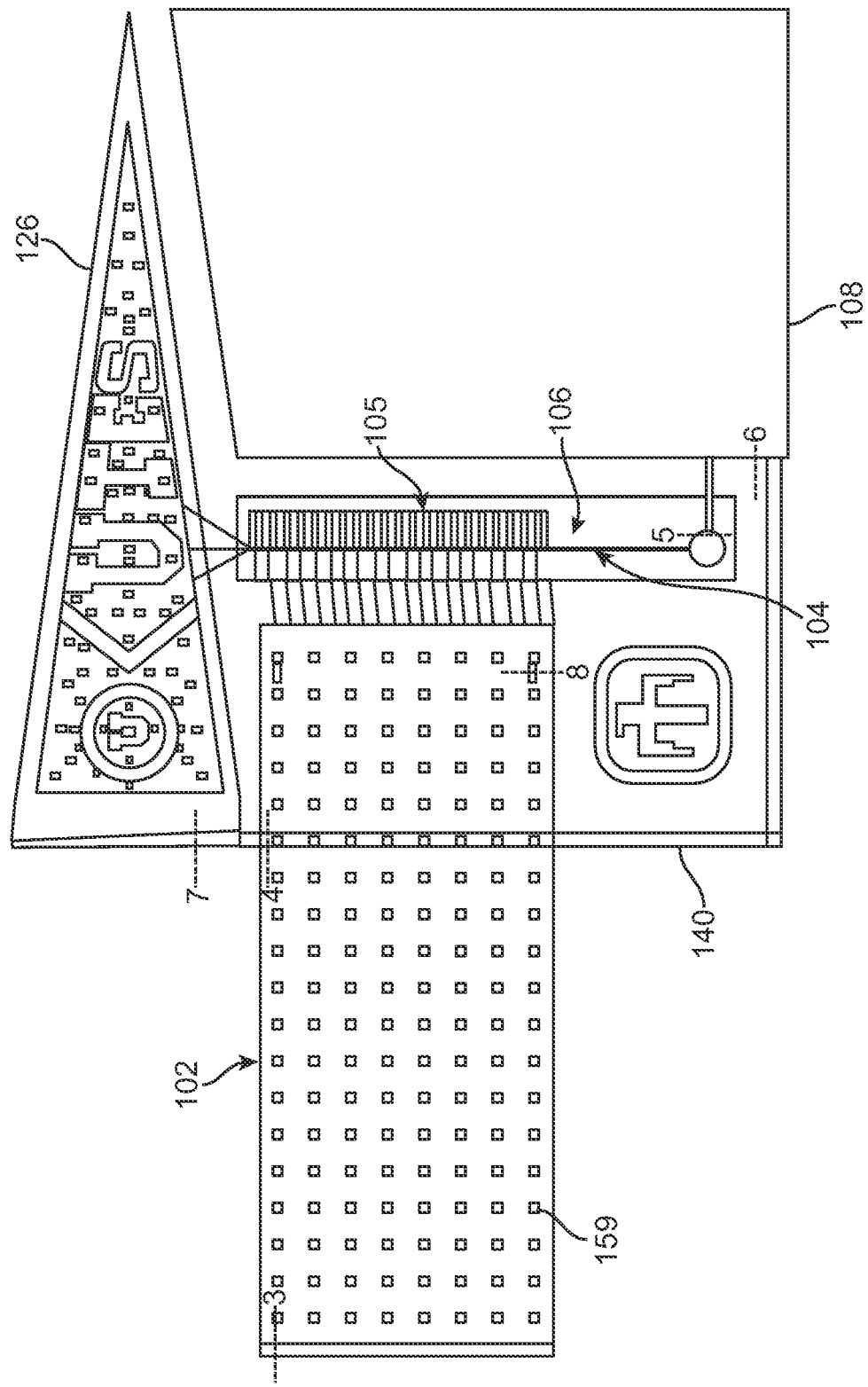
FIG. 2 is a partial top plan view of the MEMS device shown in FIG. 1.
Figure 3:
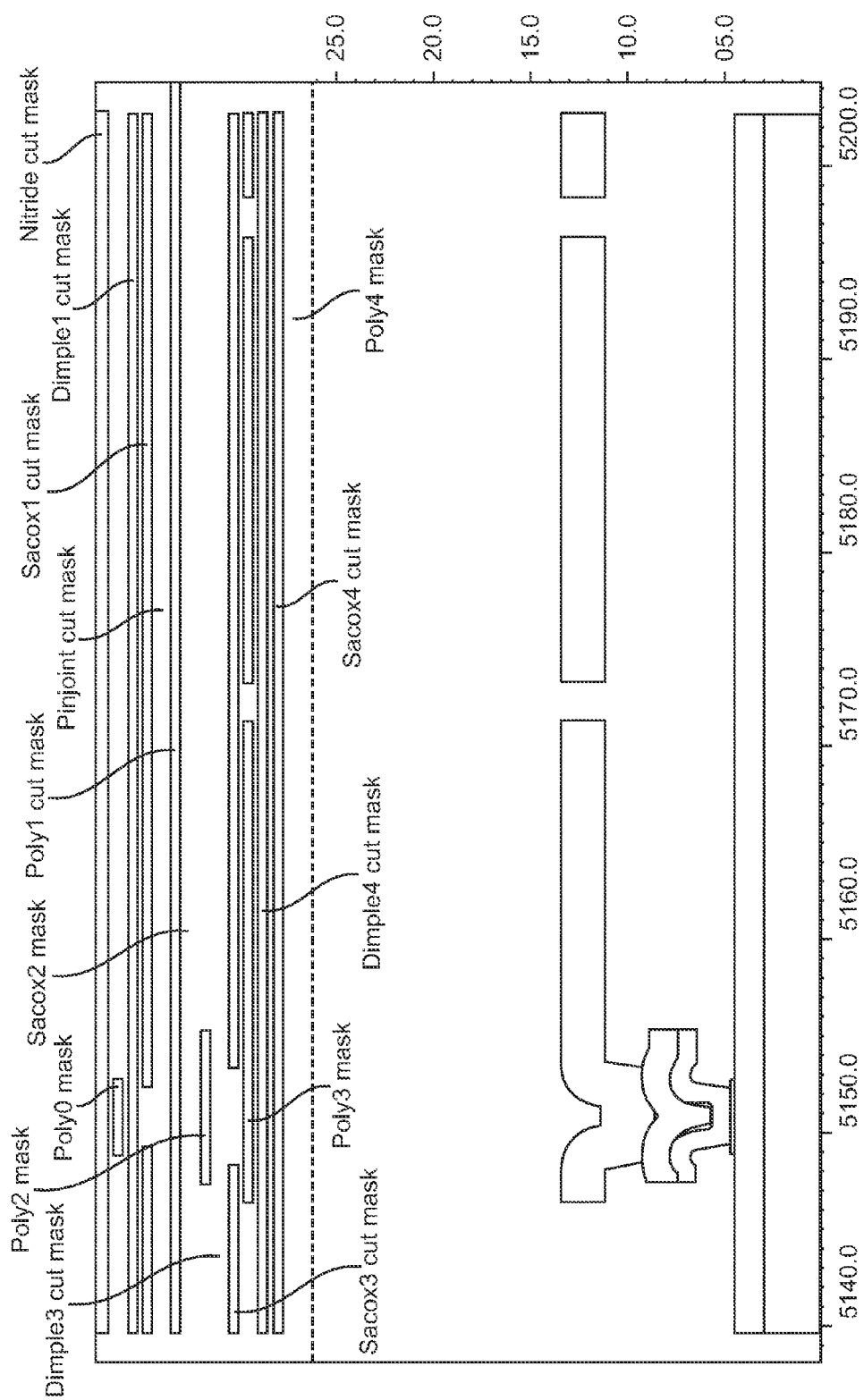
FIGS. 3-8 are cross-sectional views of the MEMS device as shown in FIG. 2.
Figure 4:
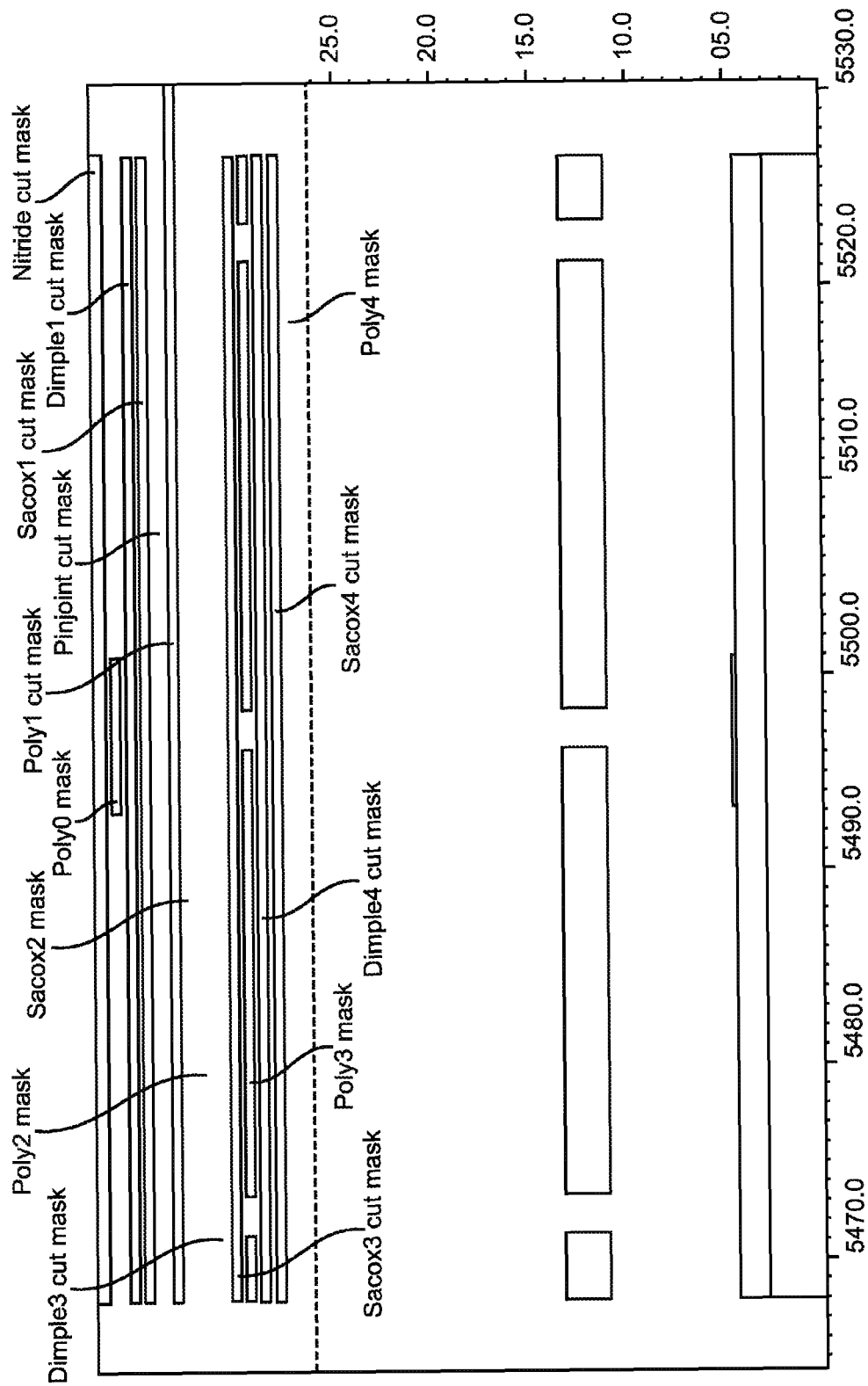
Figure 5:
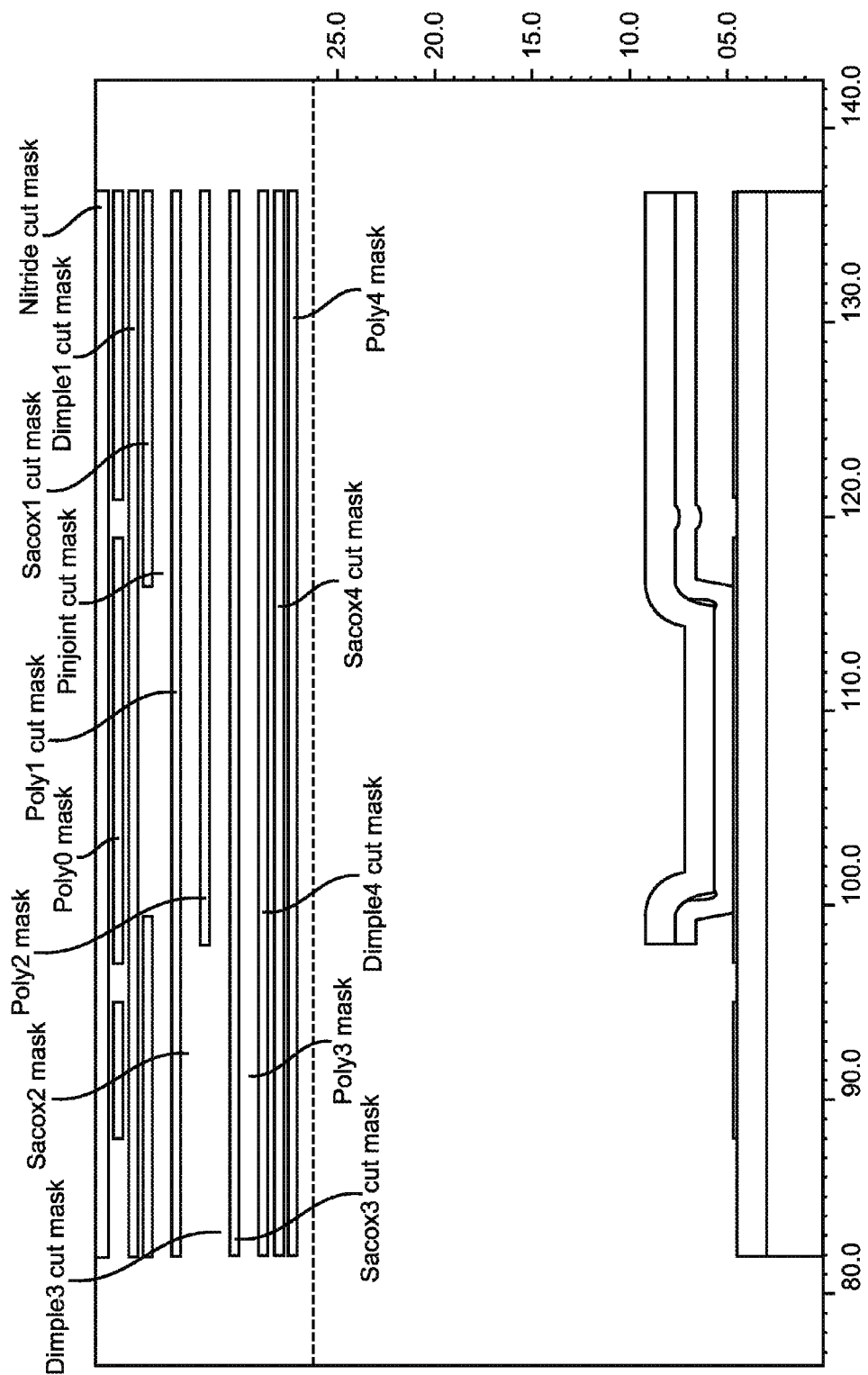
Figure 6:
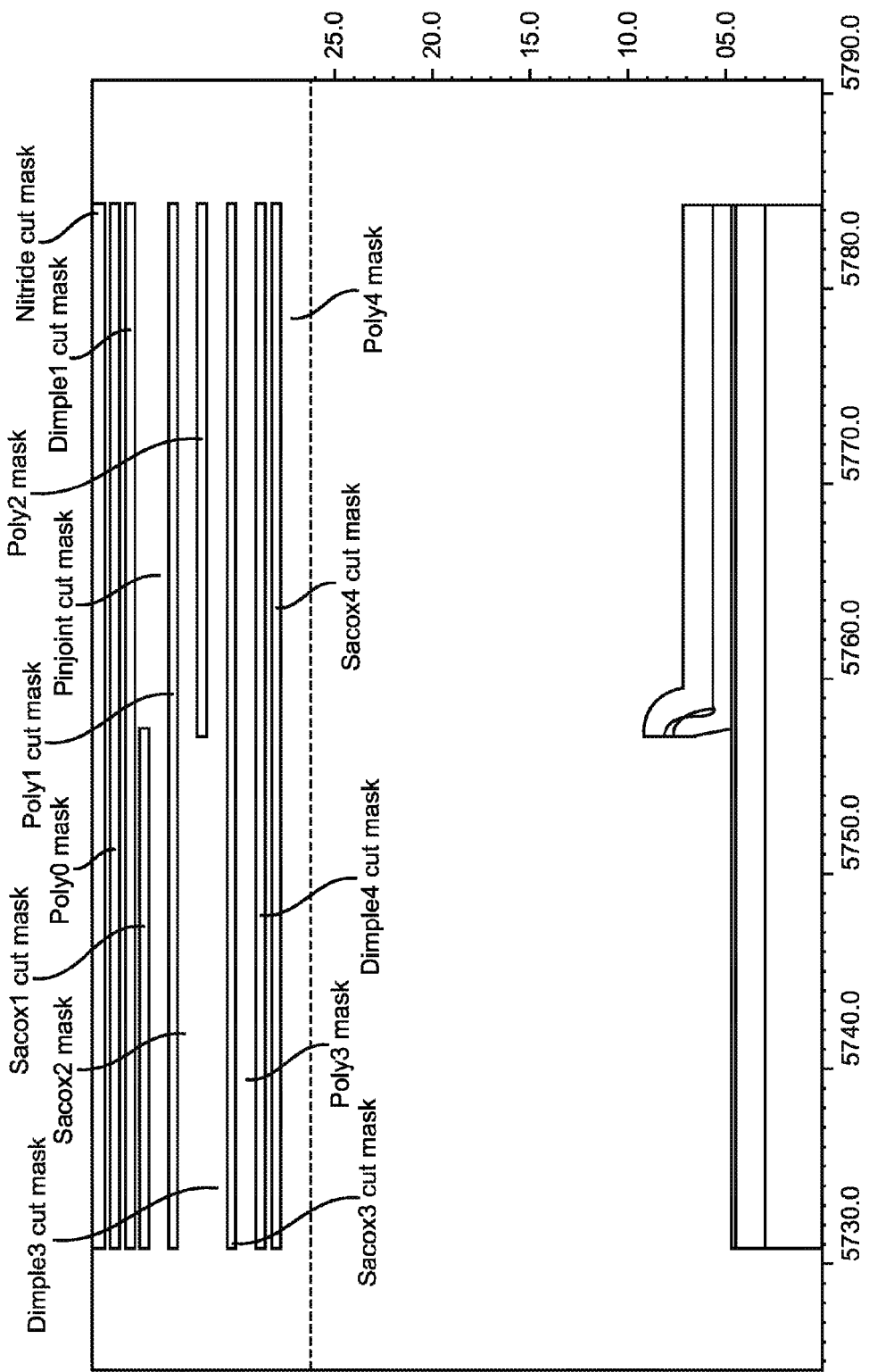
Figure 7:
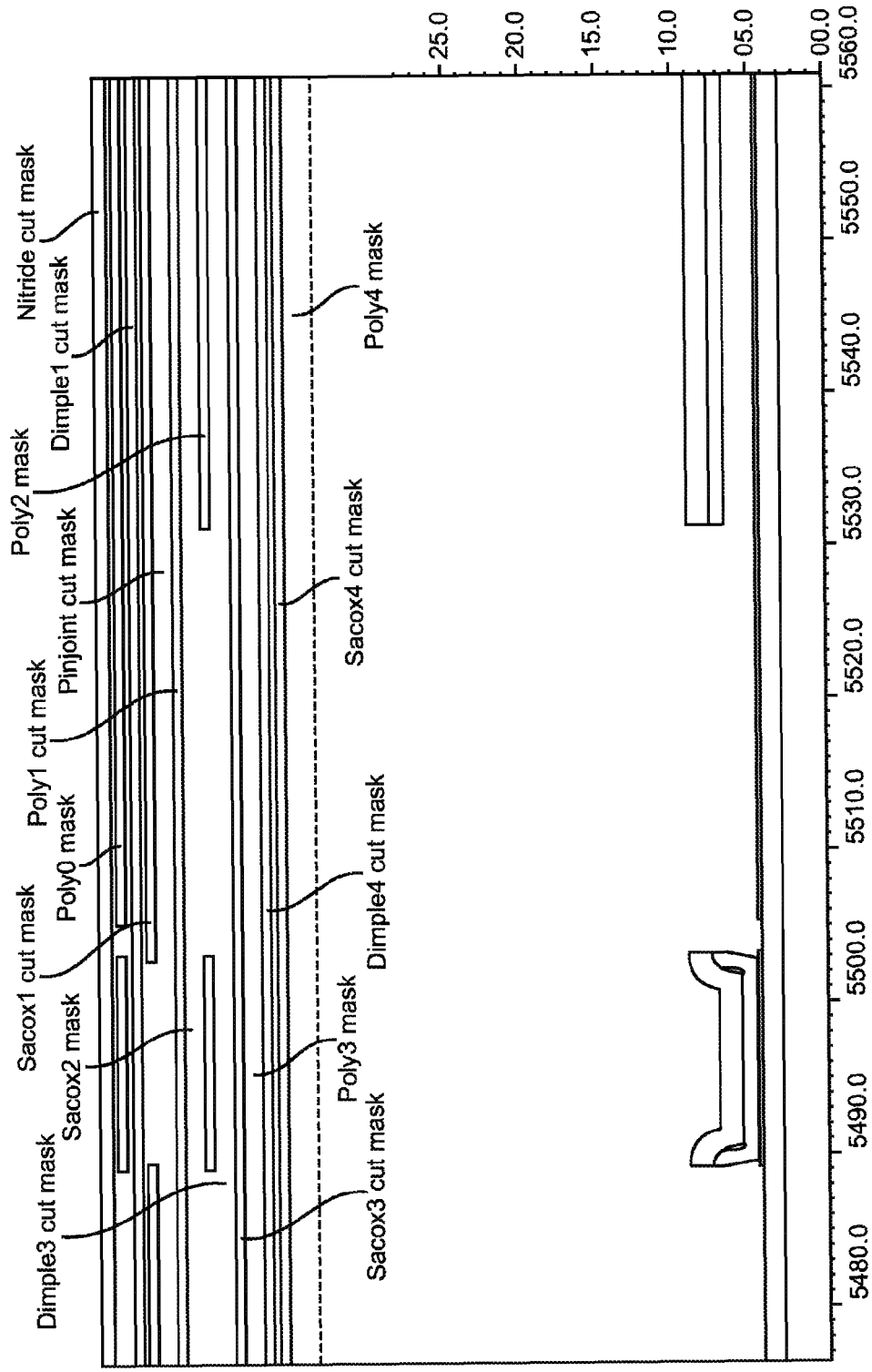
Figure 8:
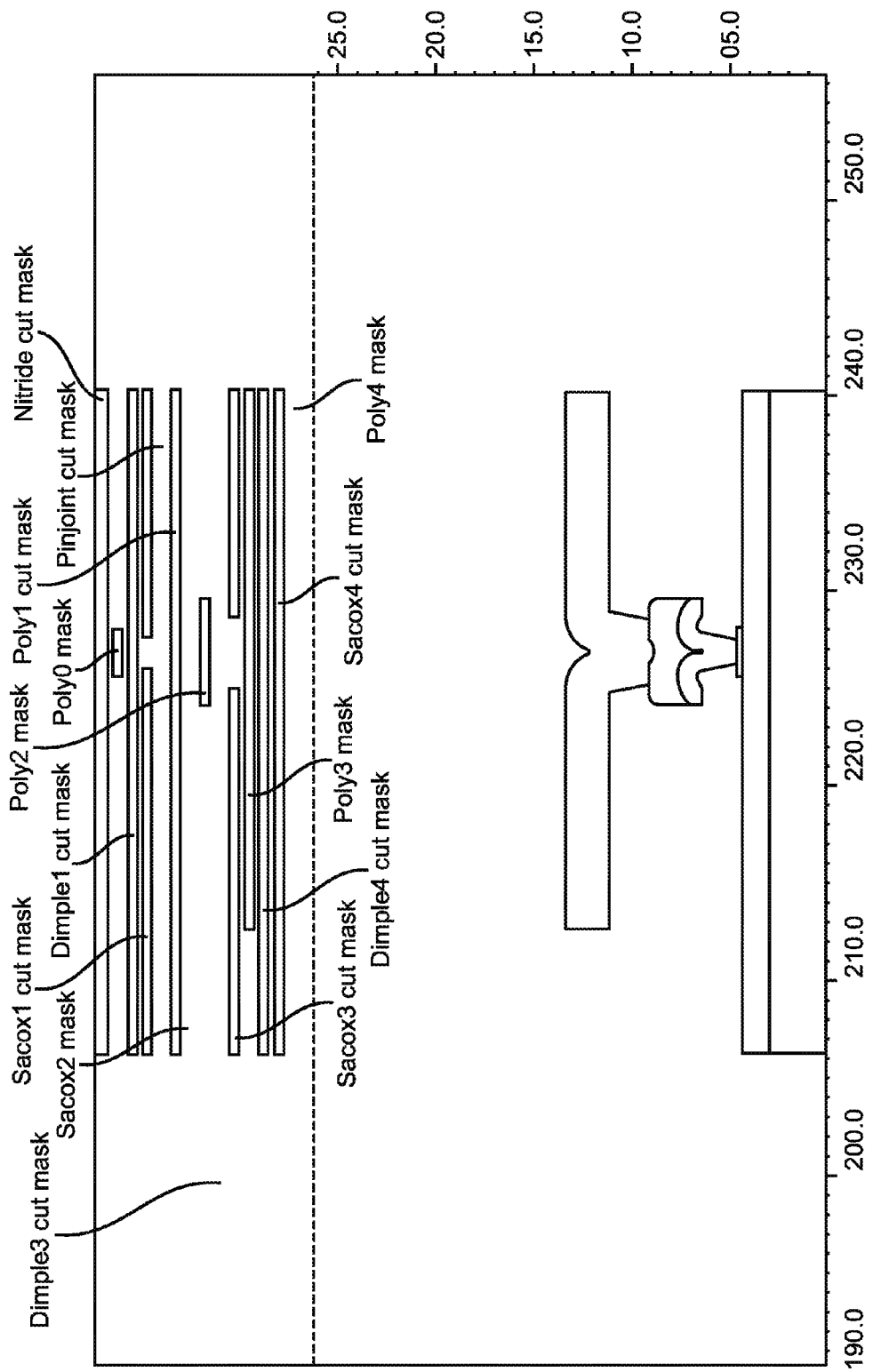
Figure 9:
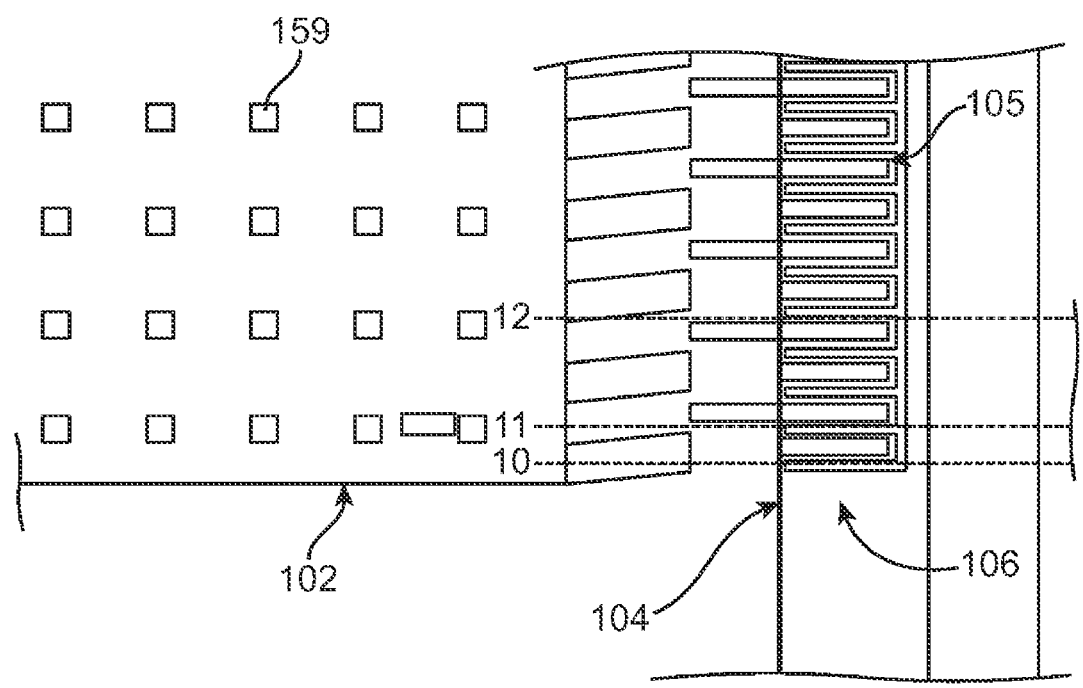
FIG. 9 is another partial top plan view of the MEMS device shown in FIG. 1.
Figure 10:
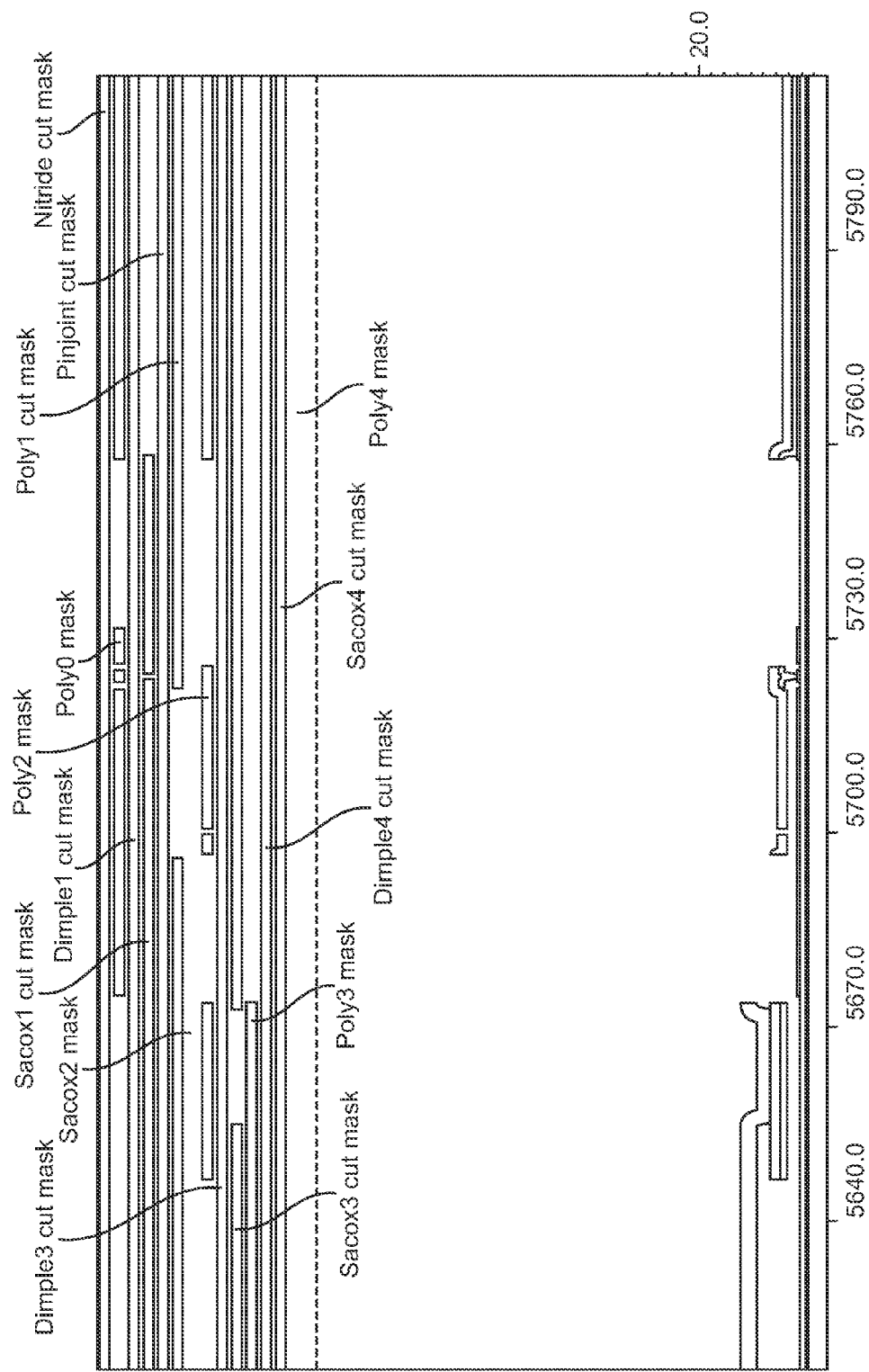
FIGS. 10-12 are cross-sectional views of the MEMS device as shown in FIG. 9.
Figure 11:
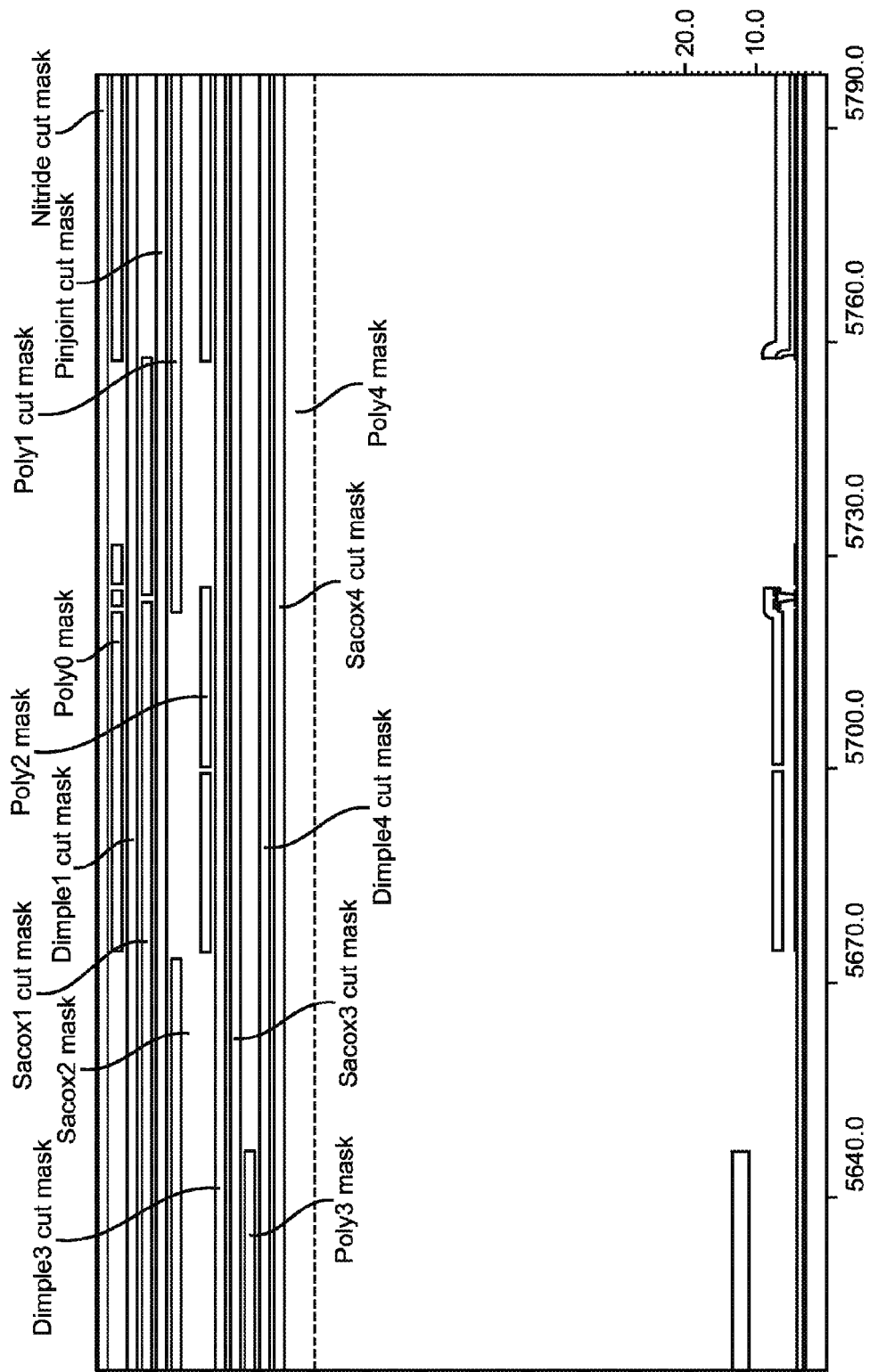
Figure 12:
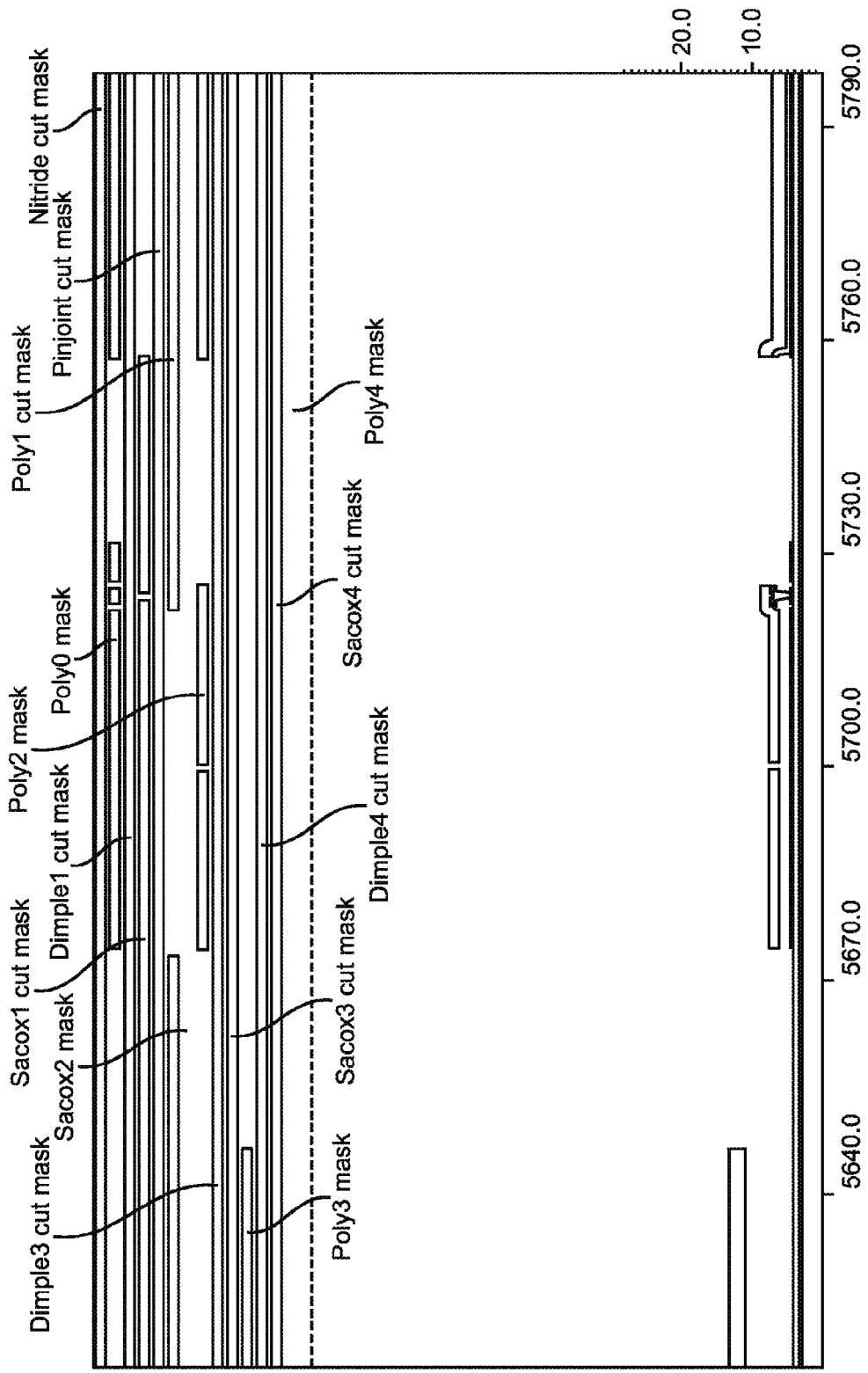

The invention may be understood more readily by reference to the following detailed description, examples, drawings, and claims, and their previous and following description. However, before the present devices, systems, and/or methods are disclosed and described, it is to be understood that this invention is not limited to the specific devices, systems, and/or methods disclosed unless otherwise specified, as such can, of course, vary. It is also to be understood that the terminology used herein is for the purpose of describing particular aspects only and is not intended to be limiting.

As used in the specification and the appended claims, the singular forms "a," "an" and "the" include plural referents unless the context clearly dictates otherwise. Thus, for example, reference to an element or member can include two or more such elements or members unless the context indicates otherwise.

Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

Embodiments disclosed herein provide a MEMS device, preferably fabricated on a silicon wafer substrate employing an actuating mechanism exploiting an energy field. In one embodiment, MEMS devices are provided for harnessing an electron beam energy field for actuation thereof.

In embodiments of the invention, a MEMS device is provided that is activated, i.e., actuated, when subjected to a non-direct-contact pathway such as an energy field. The energy field may propagate from its source to the MEMS device via free space, e.g., vacuum or air. The energy field may also be generated through electrical contacts to a source of open circuit static charge. One exemplary form of energy field suitable for use with the MEMS device is an electron beam derived from a scanning electron microscope (SEM). The electron beam may produce high static forces from injected or induced charging of the MEMS device. The charging results from structures of the MEMS device that are designed to be either primary electron traps (which develop a net negative static charge when subjected to the electron beam) or secondary-electron emitters (which develop a net positive static charge when subjected to the electron beam). The strength of the net negative static charge and the net positive static charge for a primary electron trap and a secondary-electron emitter, respectively, is influenced by accelerating voltage of the electron beam impacting the charge collection elements. The rate of charging induced by such an electron beam can be adjusted by adjusting the probe current of the SEM.

The electron beam created by the SEM, while under vacuum, is sufficiently high to impart static charge differential upon the primary electron trap and the secondary-electron emitter of the MEMS device with such magnitude as to reach, for example, thousands of volts. By using the electron beam energy field, the MEMS device may be "remotely" actuated. The actuation occurs, particularly, while the MEMS device is in the SEM that allows for visual, e.g., real-time, verification through concurrent imaging by standard SEM processes, that a desired effect has been achieved in the MEMS device.

A MEMS device that is actuated when exposed to an electron beam energy field, for example, and without limitation, enables actuation of a controlled environment wherein the MEMS device drives the engagement or disengagement of a door, a gate, a switch, or other mechanisms to control exposure to a subject specimen. The MEMS device may provide a condition-specific actuation for enabling protection of the subject specimen until the right vacuum or sample conditions are achieved.

In another example, the MEMS device may be used to control the engagement of a switch, a lockable latch or a setting of a physical indicator, e.g., a "flag." By using the MEMS device as a physical indicator, an indication as to whether the MEMS device has been tampered with, inspected or otherwise accessed may be determined. In this regard the MEMS device may be used to identify when a particular event or condition had occurred. Another application for such non-contact-actuated MEMS devices would be an aircraft lightning detector. Static charges or electric field of a magnitude exceeding a predetermined threshold may trigger a MEMS "flag," which in turn triggers an indicator or some protection mechanism. This is useful, for example, for an aircraft having a lightning strike during in-flight or ground operations. In this case the energy field that actuates the MEMS devices is the electromagnetic field associated with the lightning or with the electrical charges generated by the lightning.

In still other applications of the MEMS device, a researcher may be able to inspect an area having a MEMS actuator and leave a mark thereon by actuating the MEMS device with the electron beam energy field. The mark may be visibly observed with an optical microscope or by other means such as a laser scan while not exposed to the electron beam. It is recognized that the MEMS device may include various sizes of actuators that are sensitive to various electron beam energy field strengths. Specific embodiments of MEMS devices are further described below.

Reference will now be made in detail to the accompanying drawings to illustrate preferred embodiments of the invention. Wherever possible, same reference numbers are used throughout the drawings to refer to same or like parts.

FIG. 1 shows a top plan view of a MEMS device 100 in accordance with an embodiment. Reference may be simultaneously made to FIGS. 2-17. Those of ordinary skill in the art will recognize that such a MEMS device may be realized using existing fabrication processes, including standard IC fabrication processes. An exemplary process for fabricating the devices in accordance with embodiments of the invention uses physical and chemical deposition, photolithographic patterning, and both dry and wet etching to create mechanically-independent layers separated by sacrificial layers in surface-micromachined MEMS structures.

In the following, a fabrication process referred to as the Sandia National Laboratories ultra-planar multi-level MEMS technology (the SUMMiT-V™ process) is used for illustration purposes. SUMMiT-V™ utilizes five polycrystalline silicon (polysilicon) layers, including an electrical interconnect layer and four mechanical layers, and is exploited in fabricating exemplary MEMS devices because of the availability of the tools and the intuitive visualization provided by the tools. In particular, a 2D cross sectioning tool is used to ensure that the designer's intentions are being interpreted correctly in the individual polysilicon layers. The cross sectioning tool also helps ensure all components on the die were properly anchored to the substrate. Design rule checking ensures each mask layer is converted properly from the design to the actual mask Because various layers of the five polysilicon layers used in the process are referred to throughout this disclosure, a simplified layer terminology is used, wherein "P0" through "P4" will signify polycrystalline silicon (polysilicon) layers #1 through #5, respectively, and SACOX# will signify a sacrificial oxide layer.

The cross-sectional views as shown in the FIGS. 3-8, 10-12 and 14-18 each include a mask table representative of the actual layers used within the topography of MEMS device 100. The mask table is also representative of the dimensional length for the layers of the cross-sectional views illustrated in the FIGS. 3-8, 10-12 and 14-18, thereby allowing corresponding layers to be identified by the table when compared to the indicated cross-section of the MEMS device 100. The units as indicated in the cross-sectional views as shown in FIGS. 3-8, 10-12 and 14-18 are in microns.

MEMS device 100 includes a substrate 101, on which an actuator 106 and a ground 108 are disposed. Actuator 106 comprises a plurality of charge collection elements, such as a primary electron trap 102, a first secondary-electron emitter 104, and a second secondary-electron emitter 105. An optional electron collector 110 may also be included. Actuating member 106 may further include a body 120 having an attachment, or pivot, point 122, a spring 124, and an optional mass, or pennant, 126.

Charge collection elements 102, 104, 105 are electrically isolated from each other at least when in an uncharged state. One or more of these elements may come into electrical contact with a lead 140 that is connected to ground 108 when a charge differential is developed. The charge differential may be, for example, between primary electron trap 102 and second secondary-electron emitter 105 when these elements are "illuminated" by an electron beam energy field (not shown) from an SEM. Accordingly, a Coulombic interaction may be developed between primary electron trap 102 and second secondary-electron emitter to be sufficiently high to overcome restoring forces in spring 124.

The electrostatic attraction develops as primary electron trap 102 develops a negative charge and as second secondary-electron emitter 105 develops a positive charge. When an element of actuating member 106 comes into electrical contact with lead 140, the charge may be discharged allowing the restoring forces in spring 124 to return actuating member 106 to its original position.

In this embodiment, a pennant 126 coupled to first secondary-electron emitter 104 is utilized to make electrical contact with lead 140 to discharge actuating member 106. As would be observed, pennant 126 may oscillate, or wave back and forth, when actuator 106 actuates. Other features are included to aid visualization of the actuation process. For example, a ground path 150 is provided for a "U" symbol 152, which symbol 152 may be charged and discharged during the actuation of actuator 106 thereby showing a contrast under the SEM. "Mountains" 154 may have "white caps" 156 shown up in an SEM image when being charged positively. A plurality of etch release holes 159 may be necessary for relatively large features as specified in the fabrication process.

The biasing forces of spring 124 may be overcome solely by repulsive forces between first secondary-electron emitter 104 and second secondary-electron emitter 105 of actuating member 106. The repulsive forces are created by positively charging first secondary-electron emitter 104 and second secondary-electron emitter 105 with a supplied electron beam energy field. Optional electron collector 110 is electrically coupled to ground 108 and positioned under first and second secondary-electron emitters 104, 105 to facilitate capture of stray electrons to enhance the positive charging thereof.

To enhance actuation of actuating member 106, in addition to repulsive forces developed between first secondary-electron emitter 104 and second secondary-electron emitter 105, attractive forces between primary electron trap 102 and second secondary-electron emitter 105 may be simultaneously developed and utilized when subjected to a supplied electron beam energy field.

To enhance the strength of the attraction or repulsion forces between primary electron trap 102, first secondary-electron emitter 104 and second secondary-electron emitter 105, they each include comb structures as are understood by a person having ordinary skill in the art. However, it is recognized that any configuration of combs may be included or no combs at all may be included. U.S. Pat. No. 6,384,510, entitled "Electrostatic Microactuator with Offset and/or Inclined Comb Drive Fingers," discloses combs and fingers that may be used with the embodiments of this invention, and the disclosure of which is herein incorporated by reference in its entirety.

Figure 13:
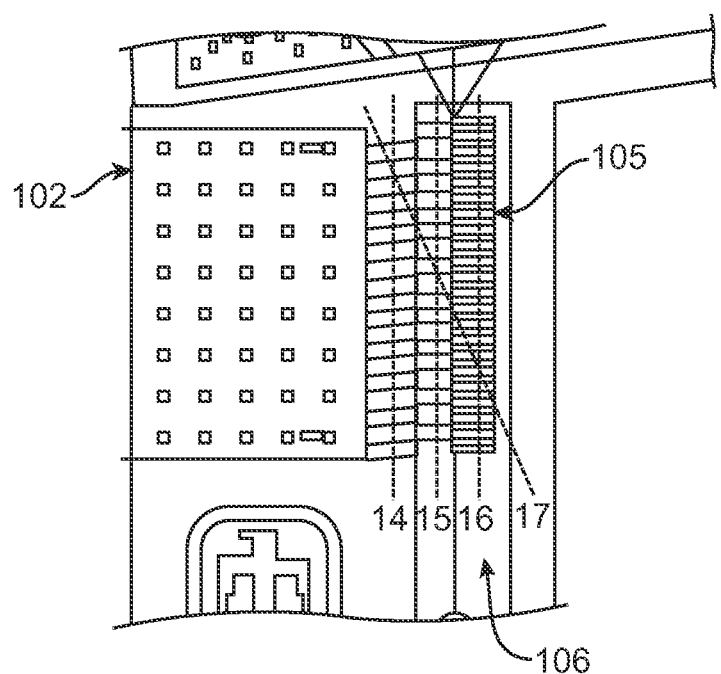
FIG. 13 is yet another partial top plan view of the MEMS device shown in FIG. 1.
Figure 14:
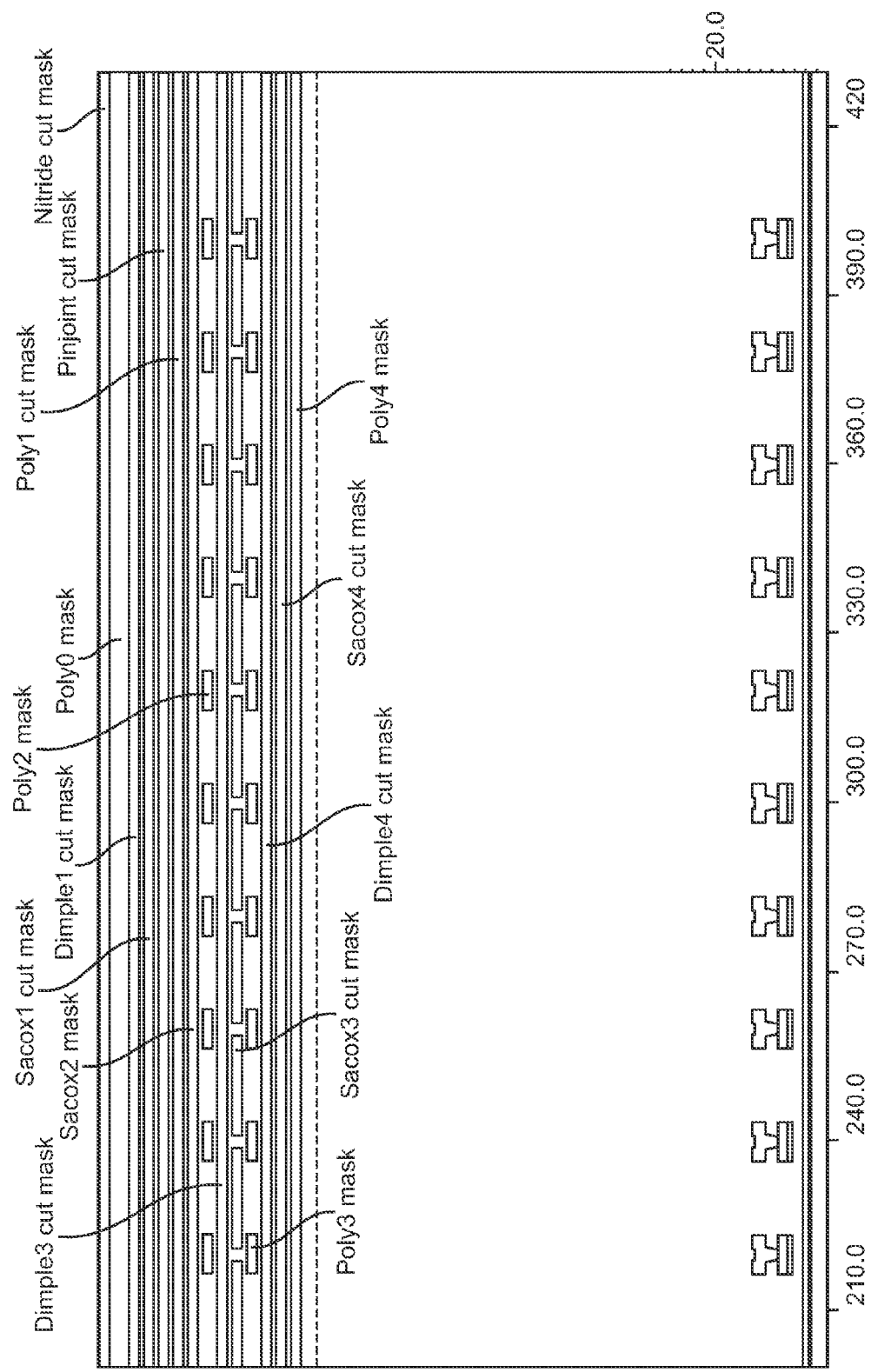
FIGS. 14-17 are cross-sectional views of the MEMS device as shown in FIG. 13.
Figure 15:
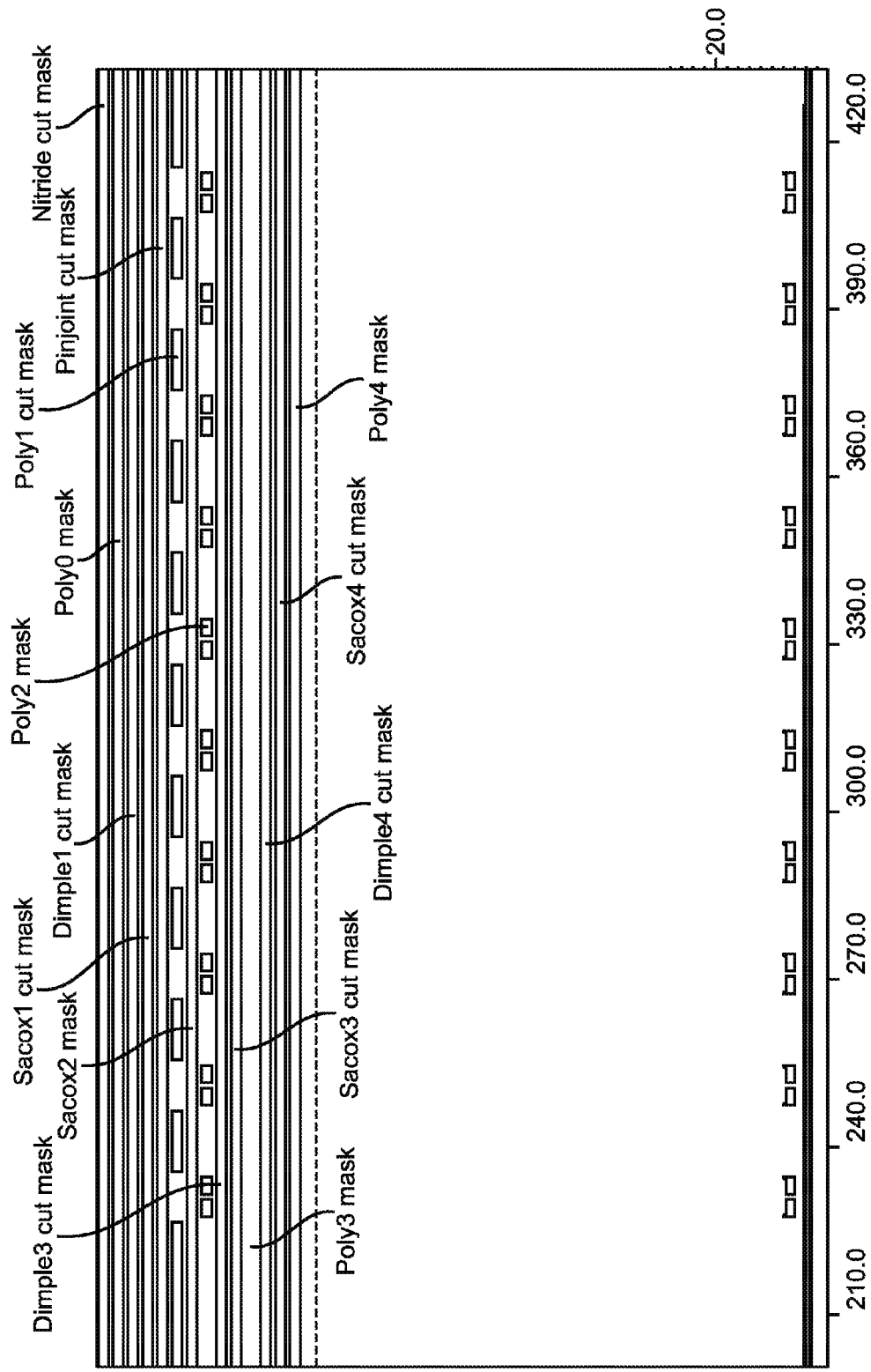
Figure 16:
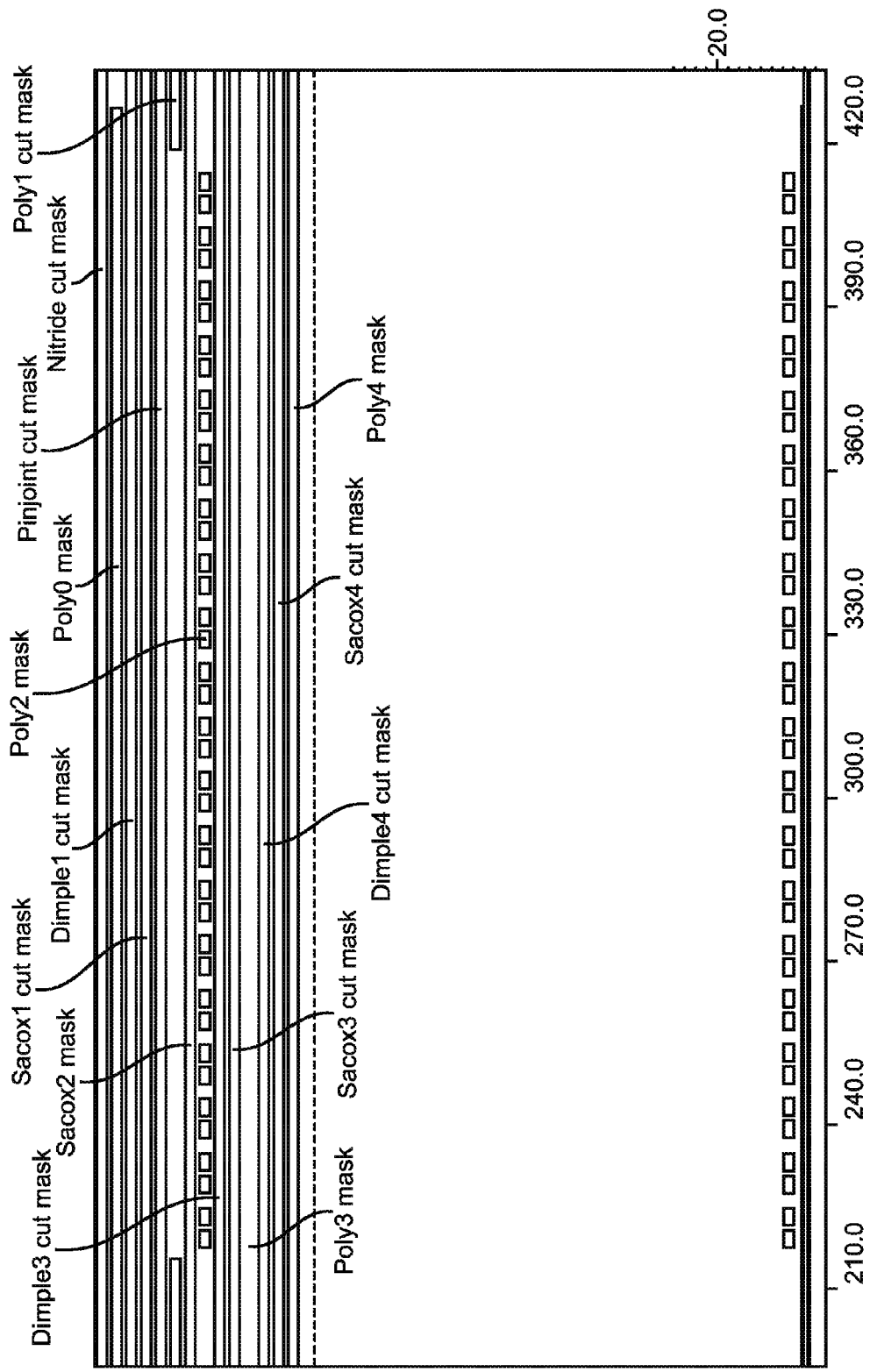
Figure 17:
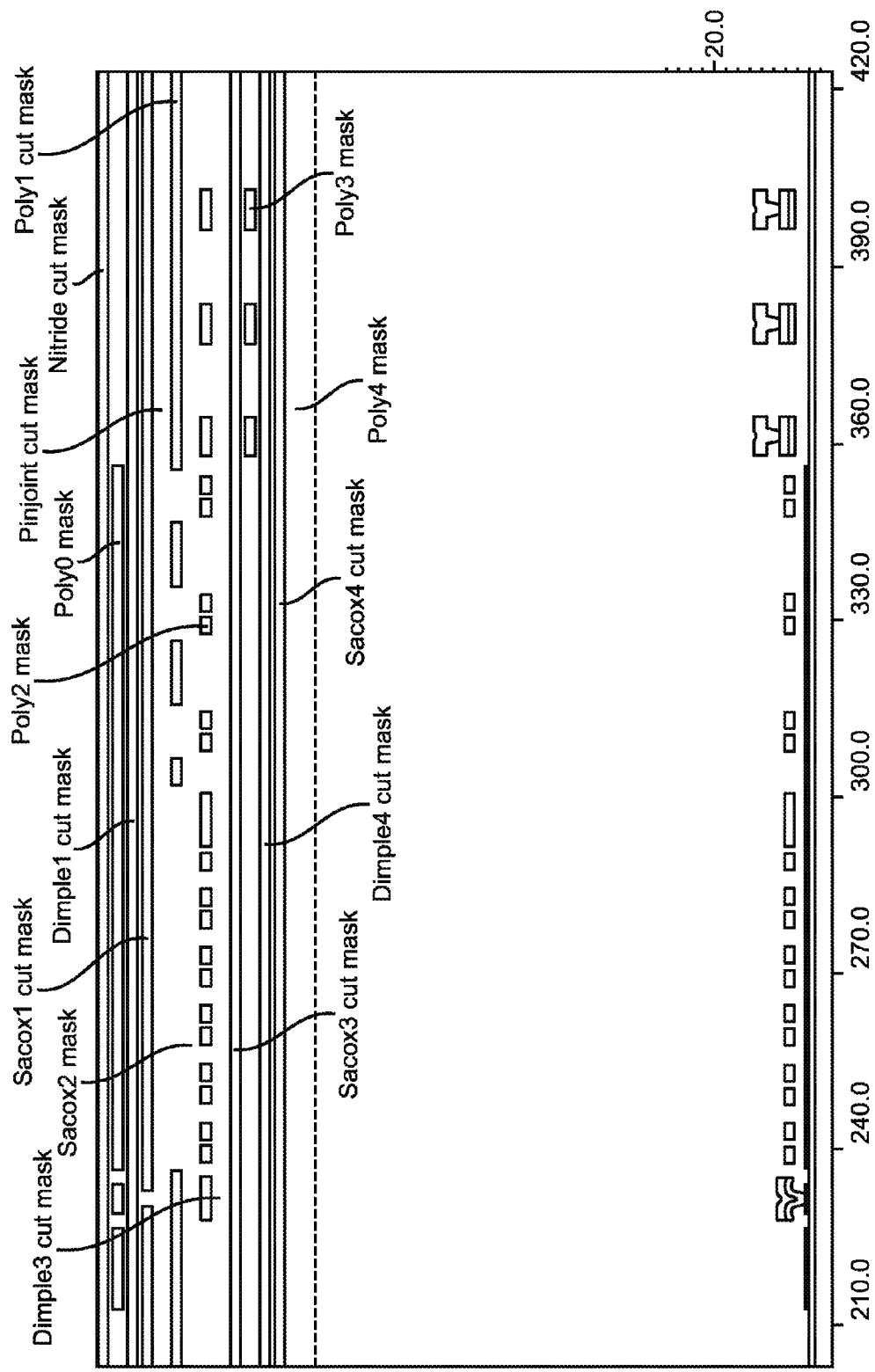

In one embodiment, primary electron trap 102 is manufactured from a Poly3 "P3" layer of the SUMMiT-V™ process, and first and second secondary-electron emitters 105, 104 are manufactured substantially from a Poly2 "P2" layer of the SUMMiT-V™ process, which are illustratively shown by the views and cross sections shown in FIGS. 2-17. For example, FIGS. 3-8 correspond to views from sections labeled as "3"-"8," respectively, as shown in FIG. 2, FIGS. 10-12 correspond to views from sections "10"-"12," respectively, as shown in FIG. 9, and FIGS. 14-17 correspond to sections "14"-"17," respectively, as shown in FIG. 13.

The P2 layer has a thickness of about 1.5 microns. The P3 layer has a thickness of about 2.25 microns. Such thicknesses allow the first and second secondary-electron emitters 104, 105 and the primary electron trap 102 to be used in conjunction with an electron beam from an SEM operating between tens to hundreds of picoamps of probe current and an accelerating voltage of about 17-18 keV. As described in detail below, the MEMS device may optionally be designed for various electron beam energy field strengths by adjusting one or more of a material secondary-electron emission characteristic, a thickness, a density, a coating, and a topography of the charge collection elements.

Figure 18:
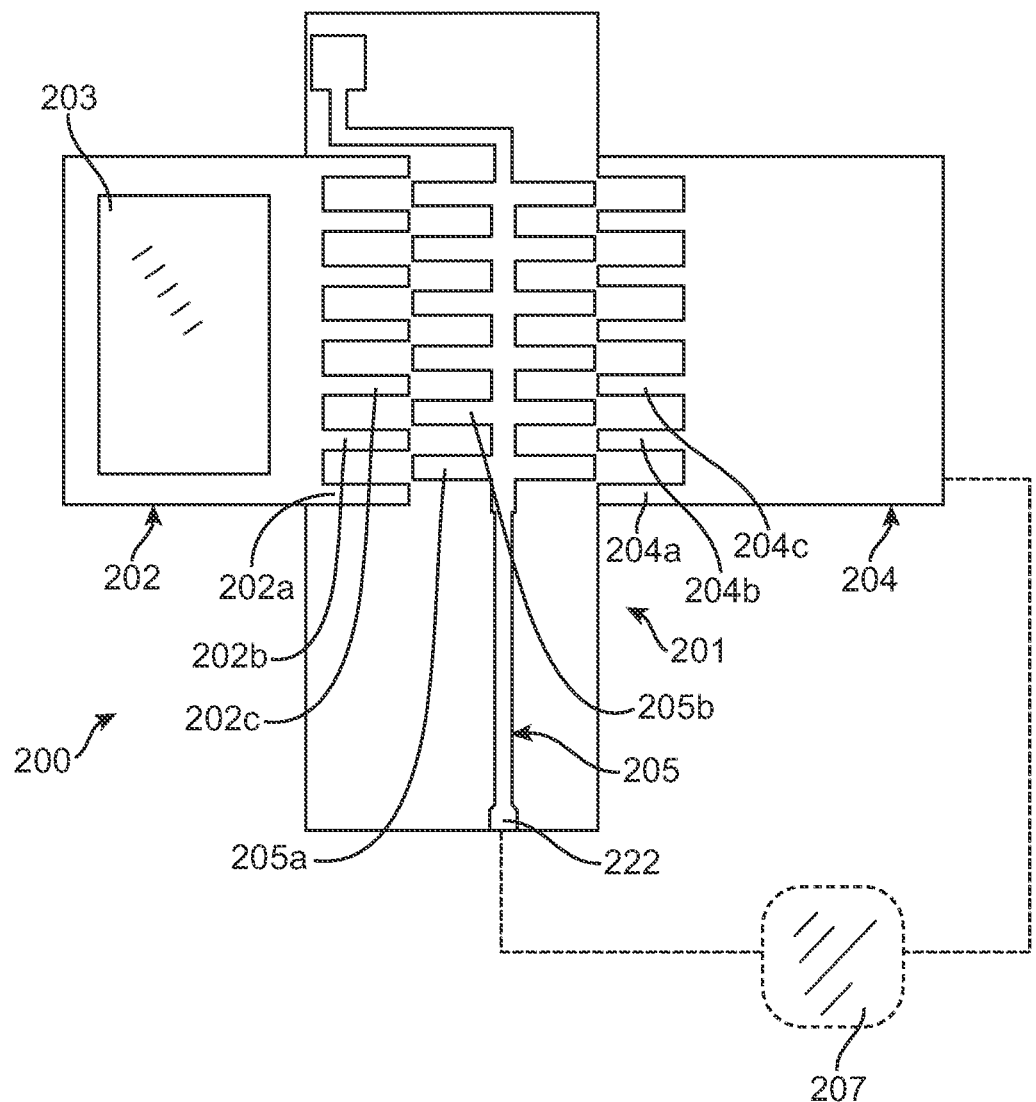
FIG. 18 is a schematic diagram of a MEMS device in accordance with another embodiment of the invention.
Figure 19A:
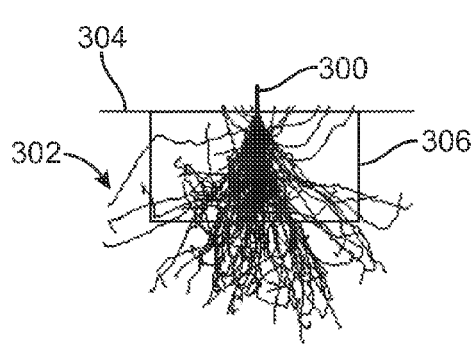
FIGS. 19A-19D are diagrams illustrating electron trajectory traces in a material at different times as simulated in a Monte Carlo simulation.
Figure 19B:
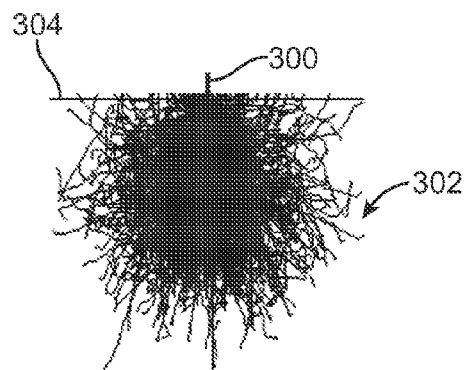
Figure 19C:
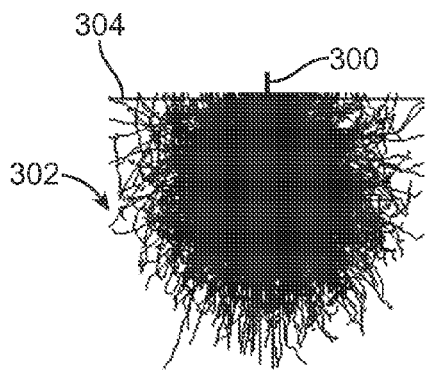
Figure 19D:
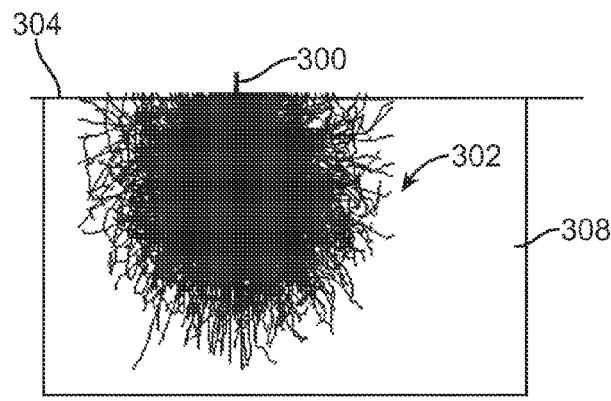

FIG. 18 is a schematic diagram of a MEMS device 200 in accordance with a preferred embodiment of the invention. MEMS device 200 is configured to be actuated by an energy field (not shown), such as an electron beam from an SEM, without externally-coupled leads or a direct-contact-coupled power source. MEMS device 200 is potentially capable of very high force output or actuation. MEMS device 200 includes an actuator 201 having a plurality of charge collection elements 202, 204, 205 each respectively having a plurality of "fingers" 202a, 204a, 205a, 202b, 204b, 205b, . . . . The fingers of neighboring elements are configured to interlace to increase the strength of Coulombic interactions. When being imaged within an SEM, device actuator 201 may spontaneously begin moving, as a result of the charges induced on the specially-designed charge collection elements 202, 204, 205.

First charge collection element 202 is configured to collect and hold negative charges created from the energy field such as the electron beam. The negative charges are created by, for example, having a P3 material with a dimension larger than the interaction volume required for retaining secondary electrons. In addition, the P3 material composing first charge collection element is isolated from an electrical ground path. In other words, first charge collection element 202 has a floating potential. Secondary electrons are generated by primary electrons originating from the electron beam impinging upon the P3 material, and are mostly retained in first charge collection element 202, resulting in a net negative charge.

The large surface-to-volume ratio of microscale machines such MEMS devices, as compared to their macroscale counterparts, makes volume-dependent characteristics and effects (such as mass, density, and the influence of gravity) almost negligible relative to the surface-area-dependent characteristics and effects such as (in this case) high surface electron density.

As shown in FIG. 18, optional features for improving charge collection efficiency include, for example, coating first charge collection element 202 with a less-dense material such as a carbon layer 203, to capture secondary electrons that would otherwise escape from the surface of first charge collection element 202. The energetic primary electrons injected into first charge collection element 202 can easily penetrate the less-dense coating layer 203, as the primary electrons from the SEM beam have an energy in the order of 10 keV. The primary electrons interact with the denser materials, such as the polysilicon, in first charge collection element 202, and come to energy equilibrium. The secondary electrons generated in the denser materials by the primary electrons are of lower energy. For example, for a secondary electron yield of 1000:1, the secondary electron energy is on the order of 10 eV. Such low-energy secondary electrons are easily trapped by the coating layer 203. In this way, first charge collection element 202 continues to collect negative static charges as being bombarded by the primary electron beam.

Second charge collection element 204 is configured to capture primary electrons efficiently and to eject secondary electron created therein thereby developing a net positive charge. In order to efficiently eject secondary electron created in the P2 material composing second charge collection element 204, the electron interaction volume must be greater than a dimension of the P2 material of second charge collection element 204. Parameters such as thickness, topography, coating and material compositions can be optimized for such purposes.

In this embodiment, third charge collection element 205 is also configured to charge positively under the energy beam. Because third charge collection element 205 as shown is relatively narrow, it may be smaller than interaction volume in both the lateral and the thickness dimensions, and may not collect as many charges as do first and second charge collection elements 202, 204.

Secondary electrons may be ejected from second charge collection element 204 and or third charge collection element 205 at a ratio of about 1000:1, i.e., for each primary electron absorbed, about 1000 secondary may be generated and may escape the surface. Thus, second and third charge collection elements 204, 205 can rapidly charge positively (e.g., electron deficient) relative to the ground potential, resulting in attraction with negatively-charged first charge collection element 202.

In the embodiment as shown, third charge collection element 205 is free floating at electrically-isolated pivot point 222, allowing third charge collection element 205 to be dynamically attracted toward first charge collection element 202 while repulsed away from second charge collection element 204, until third charge collection element 205 is discharged by making contact with a ground (not shown).

Although actuator 201 as shown comprises three charge collection elements 202, 204, 205, those of ordinary skill in the art will recognize that more or fewer such elements may be included. In addition, in the embodiment of shown, although both attractive forces between elements 202, 205 and repulsive forces between elements 204, 205 are utilized, a single type of forces or a combination of different types of forces may be used. For example, first charge collection element 202 may be removed entirely, and the resulting MEMS device may be actuated solely by the repulsive Coulombic interactions between charge collection elements 204, 205.

In a preferred embodiment, second and third charge collection elements 204, 205 have a common electrical node 207. In this case, common node 207 distributes charges pumped in by the SEM to the coupled second and third charge collection elements 204, 205 helping them repel from each other, reminiscent the effects of a Van de Graf generator.

The actuator may further include an electrical or mechanical switch, actuated by the same energy beam or other means, configured to provide a discharge of at least one of the charge collection elements, or between any of the charge collection elements and a ground. Once discharged or shorted by the switch, the actuator may restore to its original position as biased or restored by a spring member.

Attractive Coulombic interactions between the elements have the advantages of stronger interactions as the elements get closer. However, it may be necessary to allow sufficient room between the elements to avoid direct contact. On top of the actuation distance, allowance needs to be added to the distance between such attractive elements as limited by design rules. By comparison, repulsive Coulombic interactions between actuator elements tend to push the elements away from each other, thus allowing less stringent requirements on the design rules. For example, the distance between the fingers of the elements may be simply limited by design rules, which is about 1 micron in the SUMMiT-V™ process. Another advantage of using repulsive Coulombic interactions is that the fingers can be much longer (e.g., 4-5 times or more) than those of attractive Coulomb interacting elements, as in this case the fingers tend to repel each other and are less likely to make contact with each other. In this way, the traditional design tradeoffs between the force available and the actuation displacement of attraction-based comb-drives are nullified. In addition, bushings for rotational and pivoting wear ports can be made to minimize abrasive wear, since each surface is repelled from each other. Thus, friction is minimized in structures using this approach.

FIGS. 19A-21B provide more detailed descriptions of the charging process. FIGS. 19A-19D are diagrams illustrating electron traces in a material at different times as simulated in a Monte Carlo simulation. When an electron beam 300 propagating from free space (e.g., vacuum or air) impinges on a bulk of material (e.g., polysilicon) through the surface 304, primary electrons are scattered around in the material leaving traces 302. Secondary electrons are generated adjacent primary electron trajectories. Thus, the volume of traces 302 is an indication of spatial distribution of primary electrons during thermalization, and also indicates the relative source of secondary electrons when the "interaction volume" is sufficiently close to a surface to allow the low-energy secondary electrons to escape. As time lapses, FIGS. 19B-19D show that the volume increases until it "saturates" as shown in FIG. 19D, and such a volume is dependent upon the material and the energy of electron beam 300.

Other types of energy field may be used. A radiation beam of gamma rays, an electromagnetic wave (photon) beam such as a beam of UV light, a laser beam, and a beam of charged or uncharged particles or a mixing thereof from an accelerator, are also examples of an energy field that can be used to actuate MEMS devices in accordance with embodiments of the invention. Example of charged particle beams include, for example, a particles, protons, a focused ion beam (FIB) such as a focused gallium (Ga) ion beam. In addition, a static charge from triboelectric effect, and a discharge of a capacitor may also be utilized. The energy field may either directly supply charged particles to the actuator as in an ionized particle or electron flux or beam, or it may be of sufficient intrinsic energy to ionize the material of the actuator to charge collection element such that electrons are extracted from the material, leaving it in net electron deficit or net positive charge.

When other energy beams are used in place of electron beam 300, the shape and the volume of the secondary electron generation region may also vary. The minimum energy is that which is necessary to liberate an electron from the material, to escape into free space. Although the phrase "beam" is often used in describing the energy field in the description, those of ordinary skill in the art will recognize that the energy field may not necessarily have a "beam" shape. For example, the beam may be focused, unfocused, collimated, or dispersed. An electromagnetic field of any shape or spatiotemporal distribution may also be used to induce charge accumulations on the charge collection elements.

Dimensions of the material may be engineered to achieve a positive charging element or a negative charging element. For example, a length, a width, or a thickness, or a combination thereof, of a layer of material represented by a box 306 as shown is smaller than the interaction volume as indicated by traces 302. Accordingly, many secondary electrons will escape material layer 306, resulting the element being positively charged. On the other hand, material layer 308 has larger dimensions and substantially encloses the interaction volume. Thus, almost all of the electrons may be retained, resulting in a negatively charged element.

Figure 20:
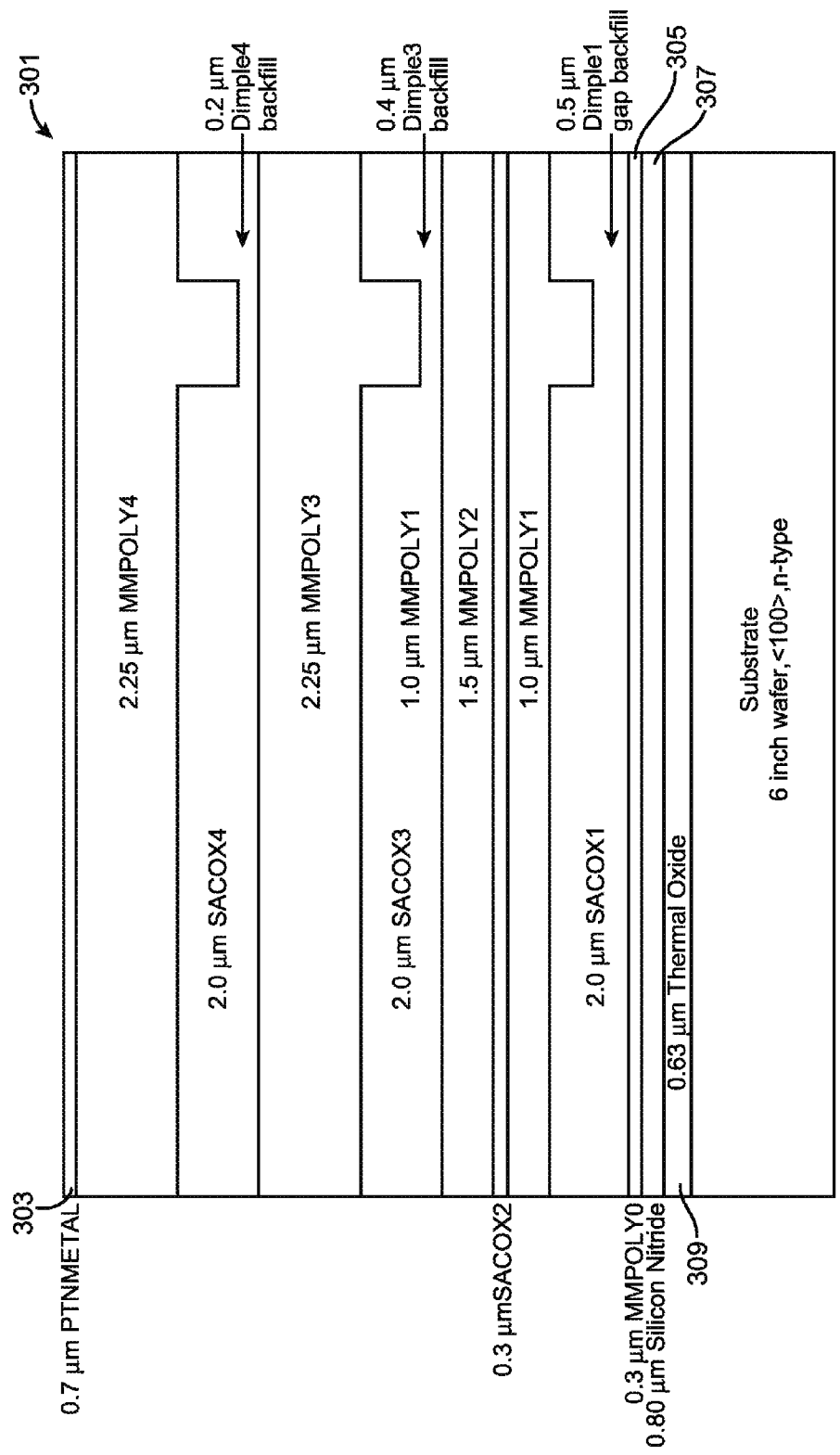
FIG. 20 is a cross-sectional view of multiple polysilicon layers used for constructing a MEMS device in accordance with an embodiment of the invention.

FIG. 20 is a cross-sectional view of multiple polysilicon layers used for constructing a MEMS device in accordance with an embodiment of the invention. As shown, surface micromachining process architecture SUMMiT-V™ is utilized, which includes a wafer composed of five polysilicon deposition layers, including four mechanical layers and a single electrical layer. In the cross-sectional view, each polysilicon layer (referenced as MMPOLY0, MMPOLY1, MMPOLY2, MMPOLY3, and MMPOLY4, corresponding to P0, P1, P2, P3 and P4, respectively) of wafer 301 is separated by a thin layer of sacrificial oxide (SACOX) which is planarized. Planarization requires the wafer to be chemically or mechanically polished to prevent its topography from being transmitted to subsequently-deposited polysilicon layers. Topographic transmission prevents the use of multiple layers as vertical features to "lock" against adjacent mechanical members. A metallization process patterns a 0.7-μm-thick metal layer 303, which may be used as electrodes.

MMPOLY0 layer 305 is used as an electrical connection for bond-pads, electrical interconnects, and a ground plane, while the NITRIDE and thermal oxide layers 307, 309 act as an electrical insulator to the substrate. NITRIDE layer 307 also acts as a protective layer for the thermal oxide layer 309 during the etch release process.

Figure 21A:
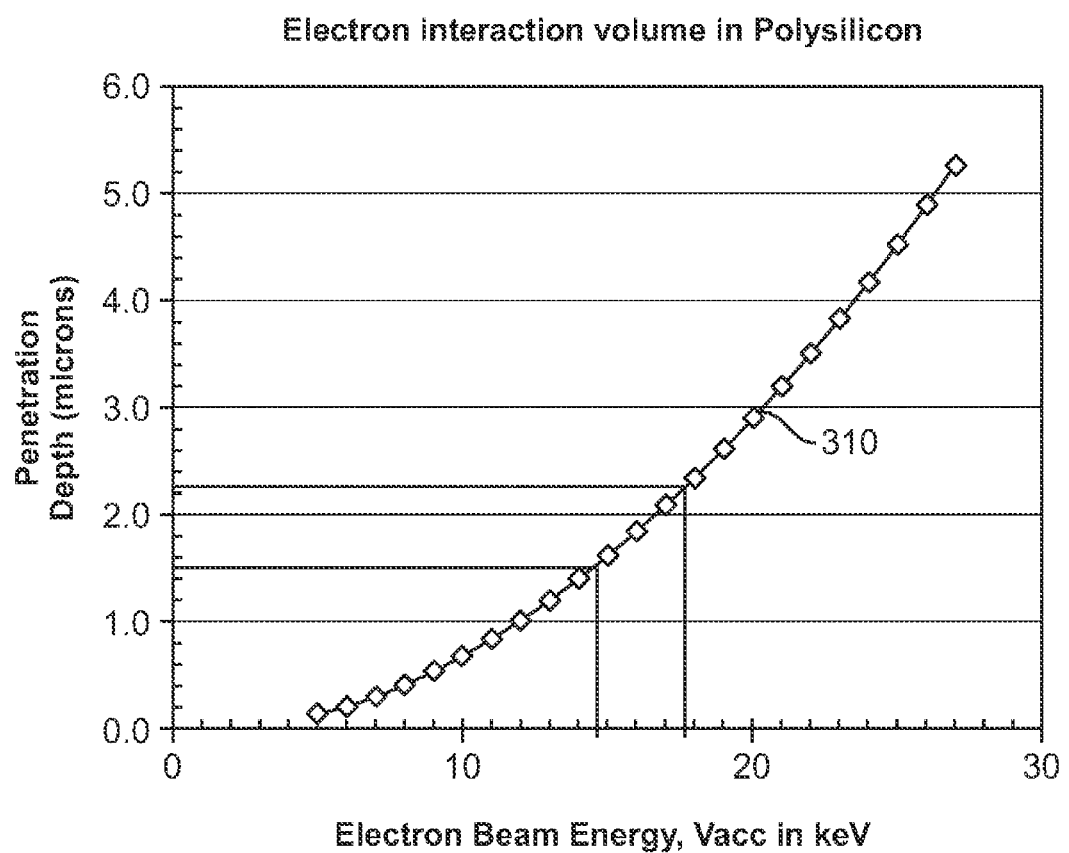
FIG. 21A is a diagram illustrating a change of electron interaction volume in polysilicon as a function of electron beam energy.

FIG. 21A is a diagram illustrating a change of electron interaction volume in polysilicon as a function of electron beam energy. Curve 310 shows that the penetration depth increases as the electron beam energy increases. For a typical SEM beam of 10-30 keV electrons, the penetration depth is about 1-3 microns.

Figure 21B:
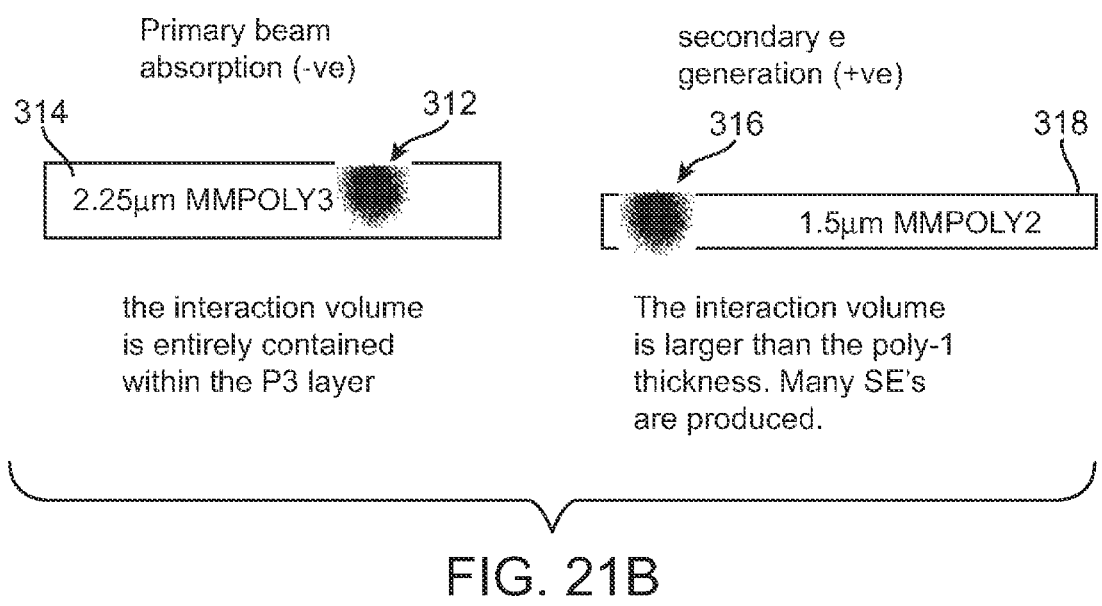
FIG. 21B is a diagram illustrating differential charging on polysilicon layers of different thicknesses.

As shown in FIG. 21B, interaction volume 312 resulting from a 14-17 keV electron beam may be contained entirely in a 2.25-micron-thick P3 layer 314, resulting in a net negative charge accumulation. On the other hand, for a thinner, 1.5-micron-thick P2 layer 318, the same reference interaction volume 316 extends beyond the material thickness. Thus, many secondary electrons may escape P2 layer 318, resulting in an effective positive charge accumulation. Other thicknesses may be achieved, for example, by coupling P2 and P3 into a thick laminate with a 3.75 micron total thickness.

By engineering thicknesses, materials, geometry/topography, and coating of the layers, optimal differential charging of elements in a MEMS actuator may be realized. For example, an element can be designed to be either a primary electron trap (net negative static charge) or an efficient secondary electron emitter (net positive static charge), for a given energy field (such as an SEM with a specified accelerating voltage).

Both repulsive and attractive Coulombic interactions can be achieved and utilized to actuate the MEMS devices.

Figure 22A:
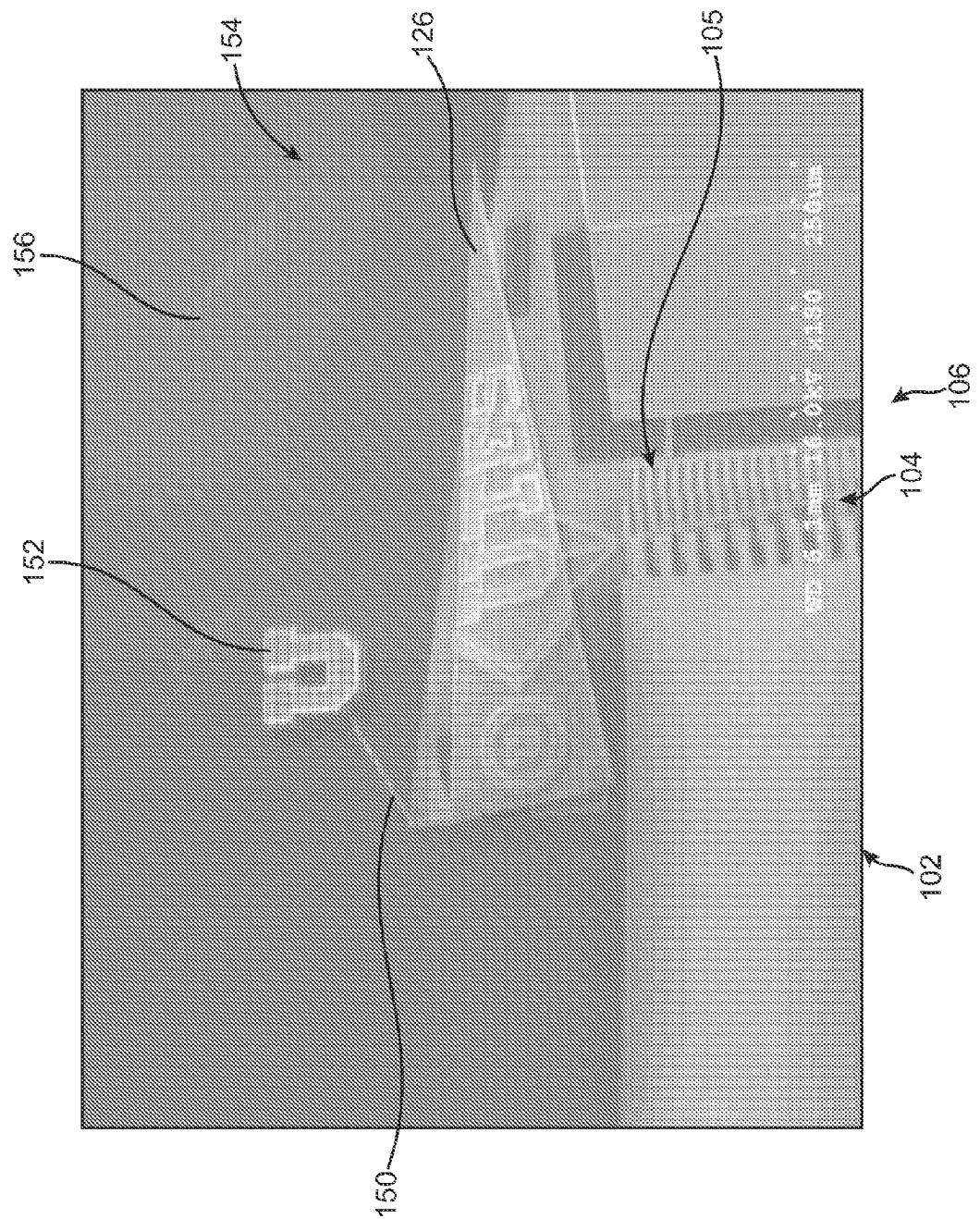
FIG. 22A is a scanning electron microscope (SEM) image of the MEMS device shown in FIG. 1 at a first position.
Figure 22B:
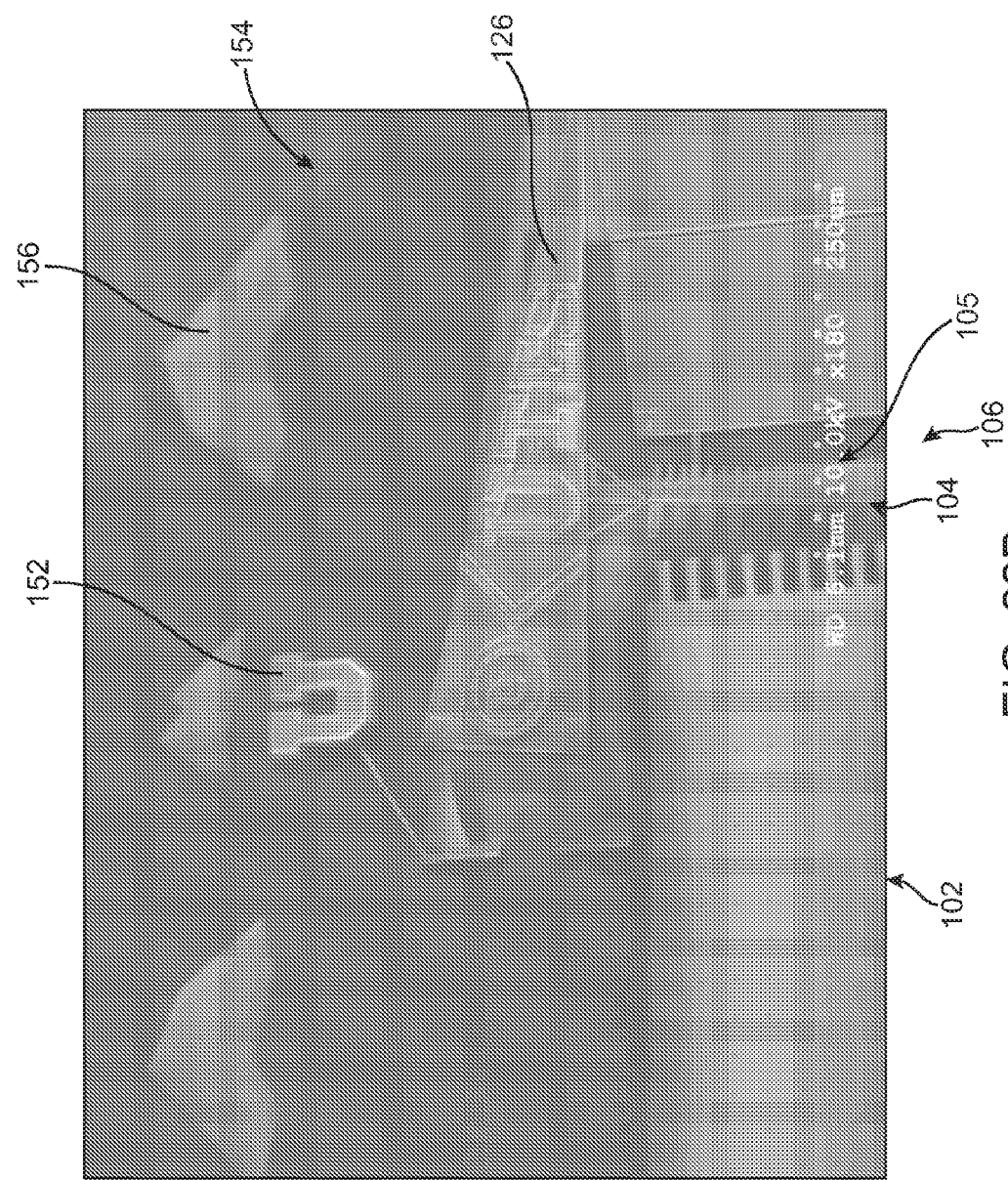
FIG. 22B is an SEM image of the MEMS device being actuated to a second position.

FIGS. 22A and 22B are SEM images of MEMS device 100 shown in FIG. 1 during an actuation process. A raster scan of the MEMS device is performed using the SEM beam to obtain these images. Certain fixed features are also isolated, and are intended to charge positive under SEM imaging, producing "white" caps 156 of "mountains" 154. An illuminated symbol "U" 152 is disposed on a "mountain." The symbols "UTES" disposed on pennant 126 are configured to "blink" in the SEM with the discharge cycle of waving pennant 126, by simultaneously closing a mechanical switch to the ground path 150 of the "U" symbol 152.

When imaged within an SEM, pennant 126 spontaneously moves as a result of the charges induced on the specifically designed charge collection elements of actuator 106. In the exemplary configuration shown, element 102 is designed to collect and hold charge from the SEM beam. This is achieved by making the element thick relative to the electron interaction volume, thereby minimizing topographical opportunities for secondary electrons to escape. In addition, the element is isolated from the electrical ground path. In the SUMMiT-V™ implementation, this may be achieved by, for example, coupling polysilicon layers P2 and P3 into a thick laminate having a total thickness of 3.75 microns.

Each finger may produce a Coulombic interaction force on the order of $10^{-9}$ N. Increasing the number of fingers can increase the total actuating force. The actuating force may also be dependent upon the secondary electron yield, the top and bottom surface areas of a completely encased "garage," the total surface area, the accelerating voltage of the SEM, the SEM probe current, the material characteristics, and the sample tilt angle relative to the impinging beam. These parameters may be optimized for an actuator in specific applications. It is also noted that the SEM beam not only can be used to charge the MEMS actuator elements, it can also be used to discharge certain MEMS actuator elements with appropriate beam energy. For example, a positively charged element may have the net positive charge "neutralized" by an SEM beam with an energy lower or higher such that the primary electrons are absorbed by the element without producing many escaping secondary electrons. Similarly, higher or lower energy SEM beams may be used to discharge negatively charged actuator elements, depending upon the tactics used to charge the elements in the first place.

MEMS device 100 shown in FIG. 1 is configured to provide a large potential difference between the electrodes by purposefully driving one electrode negative, and the other two positive. Under "molecular flow" vacuum conditions (e.g., ~$10^{-6}$ Torr) found in research class SEMs, there are very few gas molecules in the vacuum chamber. In this case, the charge-production rate on actuator 106 by the energy beam greatly outnumbers the rate of random gas collisions onto the rapidly charging structure.

Many lower-cost SEMs, e.g., "desktop" SEMs, which operate at about 15 keV, do not have vacuum levels as good as research class SEMs. The more abundant gas molecules operate in "viscous flow." Thus, the addition or removal of a gas molecule is immediately "felt" by not only neighboring molecules, but the effect is also dynamically transferred throughout the chamber. In this "viscous flow" regime, negative charges (excess electrons) are very efficiently gathered up by the frequent collisions of gas molecules, and the residual gas "carries off" the charge. Positive charges are not so efficiently dissipated, because there is no "particle" to whisk away. The positive charge neutralization mechanism is reliant upon a donor molecule, with a sufficiently low ionization energy to give up an electron. Among the gases available in the residual vacuum ($N_2$, $O_2$, $H_2O$), the water molecule $H_2O$ is most likely to be positively charged, and this still requires substantial energy.

Thus, in relatively higher-pressure vacuum environments (e.g., >100 mTorr), it is preferable to use repulsive Coulombic interactions. This may be achieved by charging the charge collection elements positively and tie them together onto a common electrode so that they repel each other. A spring action may be designed to bring the elements back together following a discharge to, or from, ground.

Figure 23A:
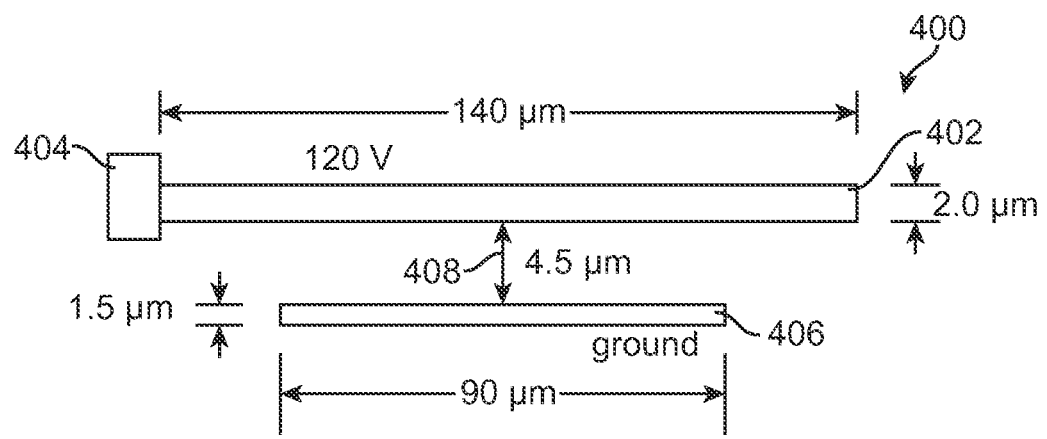
FIG. 23A is a schematic diagram of a MEMS test structure in accordance with an embodiment of the invention.

Comb-attraction based actuators can still be used in less-perfect vacuum conditions. Instead of creating a negative electrode, a path to ground may be provided so that negative charges are not being continuously produced. Rather, many secondary electrons are produced out of the bottom of the positive electrode, where the small gap from the electrode to the ground makes it possible for many secondary electrons to be both produced and to have an opportunity to escape without recollection onto the actuator. The charge difference between the induced positive electrode and ground translates to a potential difference by the capacitance between the two points, and the Q=CV potential difference results in an attractive force between the two, thereby producing the attractive "chomping" action. This attractive force is demonstrated in the simulation shown in FIG. 23B for a test structure 400 as shown in FIG. 23A, wherein charged cantilever 402 is attracted to ground 406. This configuration is thus also suitable for operation in viscous flow vacuum environment.

FIG. 23A is a schematic diagram of a MEMS test structure 400 in accordance with an embodiment of the invention. Test structure 400 includes a cantilever 402 fixedly coupled to a substrate (not shown) at a pivot point 404. Cantilever 402 is suspended above a "ground" member 406 at a distance 408. As shown, distance 408 is about 4.5 microns. Cantilever 402 is about 2.0 micron thick while ground member 406 has a thickness of about 1.5 microns.

Figure 23B:
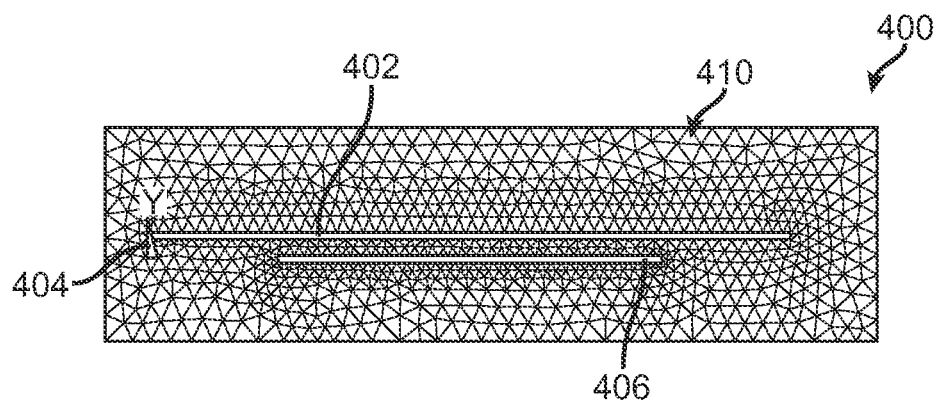
FIG. 23B is a diagram illustrating a simulated deformation of the MEMS test structure of FIG. 23A.

FIG. 23B is a diagram illustrating simulated deformation of MEMS test structure 400 of FIG. 23A. Triangular spatial elements 410 are used in simulations of displacement of cantilever 402 relative to ground member 406 when cantilever 402 and ground member 406 are differentially charged by an energy field.

Figure 23C:
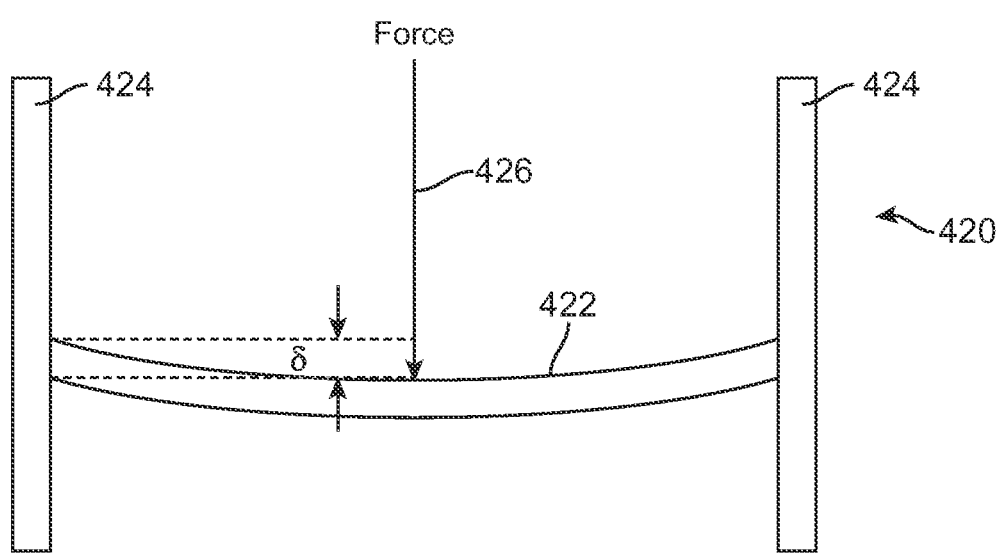
FIG. 23C is a schematic diagram illustrating a relationship between the deformation of the MEMS test structure and the force imposed on the structure.

The displacement of cantilever 402 depends on parameters such as the material stiffness and the length of the cantilever. FIG. 23C is a schematic diagram illustrating a method of design a structure with desired dimension. In test structure 420, an elongated arm 422 is constrained on both ends by structures 424 orthogonal to arm 422. A force 426 is applied to elongated arm 422, causing a displacement distance δ=0.25 μm. Arm 422 is made of polysilicon with a modulus of elasticity E=169 GPa. Elongated arm 422 has a width b of about 4 μm and a thickness h of about 1 μm. The moment of inertia I=$bh^3/12$. For example, with a desired displacement distance δ=0.25 μm and a desired force from a comb drive w=10 μN, the length of elongated arm 422 should be L=$(185$ E I δ/w$)^{1/3}$=64 μm.

Figure 24A:
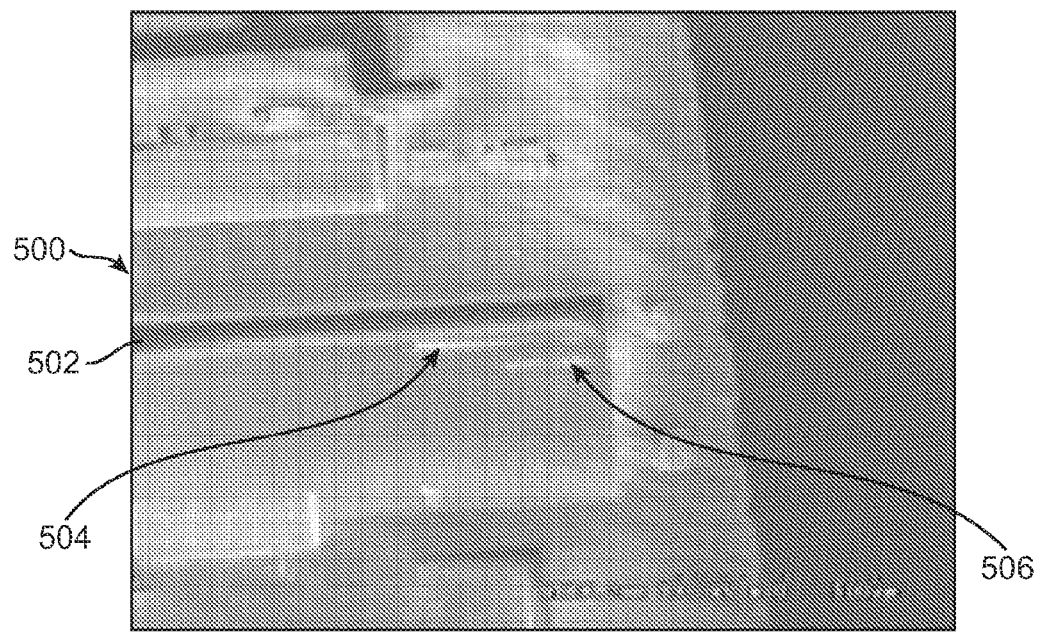
FIG. 24A is an SEM image of a fabricated test structure before being actuated.
Figure 24B:
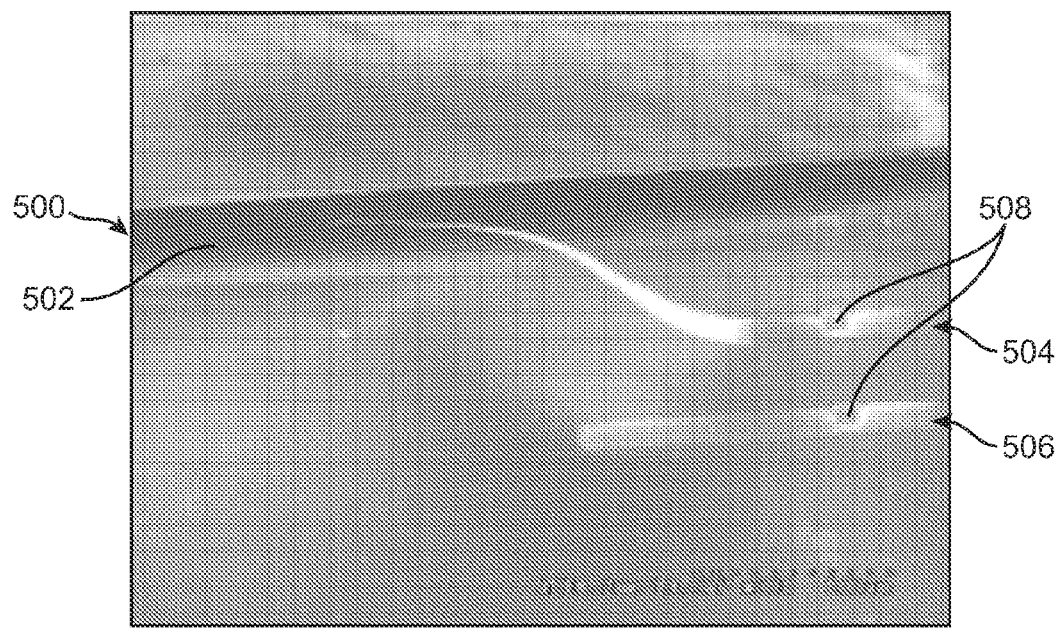
FIG. 24B is an SEM image of the test structure of FIG. 24A being actuated.

FIGS. 24A and 24B illustrate the results from a test structure 500 including an aluminum substrate 502, and aluminum ribbons 504, 506 disposed on substrate 502. A photoresist layer is disposed between ribbons 504, 506 and substrate 502. Ribbons 504, 506 are charged by the SEM beam, and the packing of electrons onto the electrical node 508 common to substrate 502 and ribbons 504, 506 causes the longer ribbon 504 to elevate off substrate 502.

Common node 508 results in both ribbon 504 and substrate 502 being pumped with electrical charges by an SEM analogous to Van de Graf generation, and ribbon 504 and substrate 502 tend to repel each other, similar to hair on the head of a person touching an operating Van de Graf generator. These aluminum ribbons 504, 506 also demonstrate the beneficial aspects of microfabrication in that the surface-to-volume ratio is so large that the electrostatic (surface) effects vastly dominate over (bulk) gravity effects.

The structures in FIGS. 24A and 24B may be viewed as an open-circuit, same-charge configuration. In closed-circuit, same-charge configurations a power supply is used, and two nodes at a common potential may not repel from each other. In open-circuit (charge-pumped) configurations, additional electrons are forced onto the common node, and they attempt to separate from each other as far as possible due to Coulombic interactions, thereby giving rise to repulsive forces.

Figure 25:
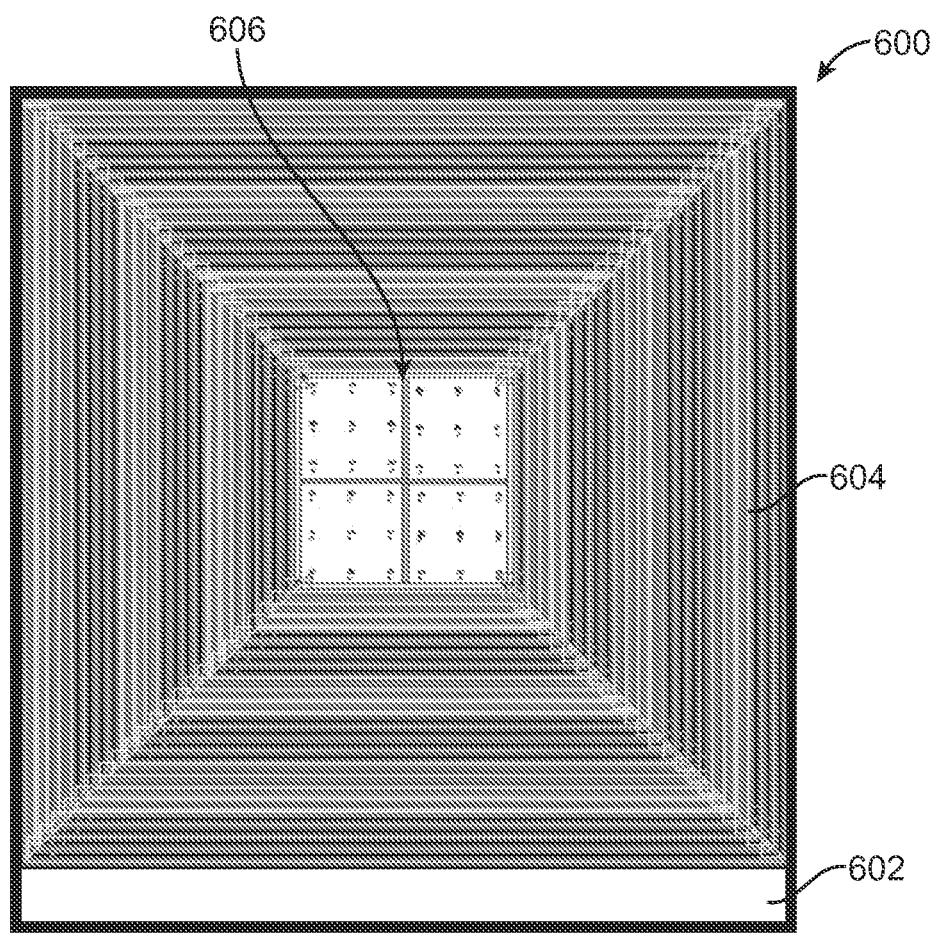
FIG. 25 is a top plan view of a MEMS device utilizing the micro charge pump actuating mechanism to lift a platform from a surface in accordance with an embodiment of the invention.

The micro charge pump actuation mechanisms in accordance with embodiments of the invention can be applied to MEMS devices with various actuation directions. FIG. 25 is a top plan view of a MEMS device 600 having an actuation direction vertical to the substrate surface. MEMS device 600 includes a substrate 602, a pyramid-shaped (when extended) spring member 604 disposed on substrate 602, and a platform 606 disposed on spring member 604. In the uncharged state, spring member 604 is collapsed and resides substantially in the same XY plane as substrate 602. By charging substrate 602 and top platform 606 with the same polarity using an energy field, the repulsive force between substrate 602 and top platform 606 may overcome the spring force from spring member 604, and raise top platform 606 from the XY plane of the wafer. This may find applications in, for example, tactile feedback for touch screens and tablets. Further, asymmetrical lifting of top platform 606 may be designed such that top platform 606 may be tilted. This is useful in adjusting, for example, mirrors that are used to control optical paths.

Figure 26:
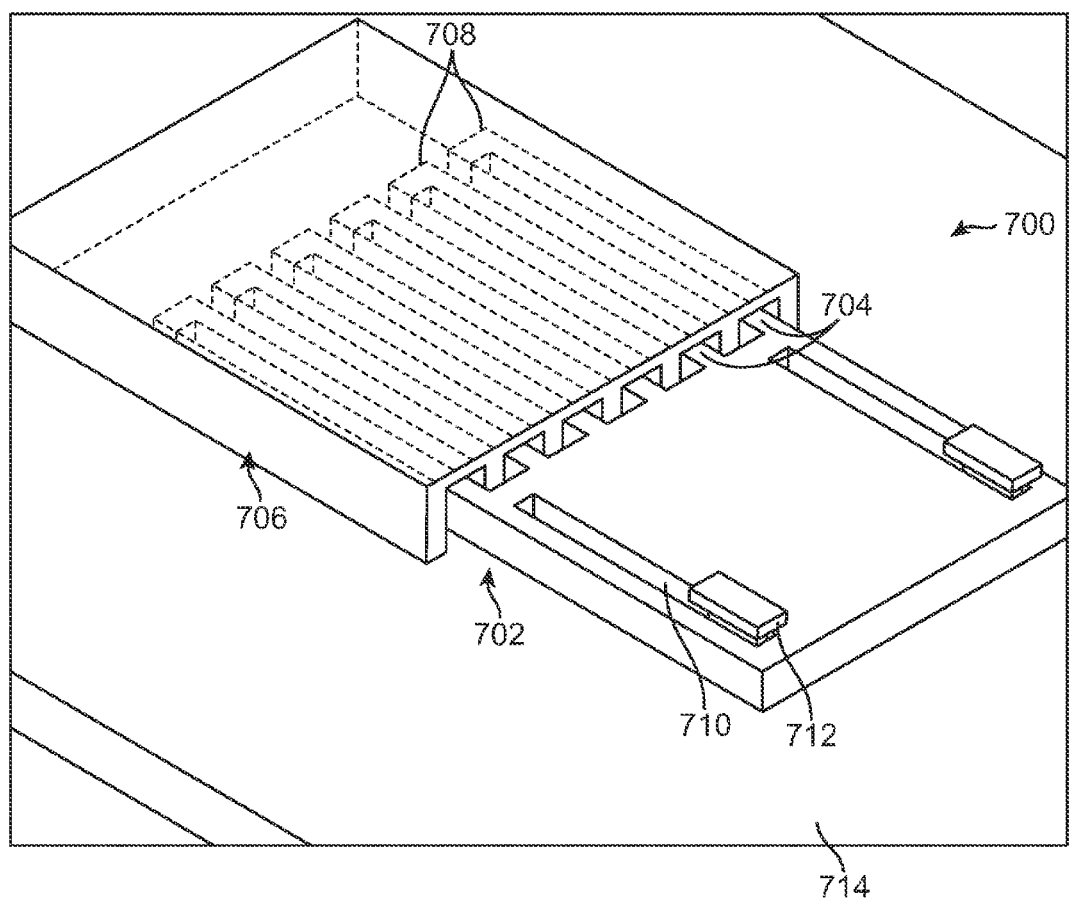
FIG. 26 is a perspective view of a MEMS device utilizing the micro charge pump actuating mechanism to realize a longitudinal motion.

In addition to actuation directions transverse to the elongated direction of the actuator elements as shown in embodiments of FIGS. 1 and 18, the actuating mechanism in accordance with embodiments of the invention can also be applied to actuating longitudinally. FIG. 26 shows such an example. As shown, MEMS device 700 includes a first element 702 having a plurality of extrusions 704. In the position as shown, extrusions or fingers 704 of first element 702 are substantially enclosed in respective retentions 708 of second element 706. First element 702 is slidably coupled to substrate 714 through slots 710 and vertical members 712 fixedly coupled to substrate 714. By charging first and second members 702, 704 using an energy field as described earlier, first member 702 is actuated telescopically relative to second member 706.

Figure 27:
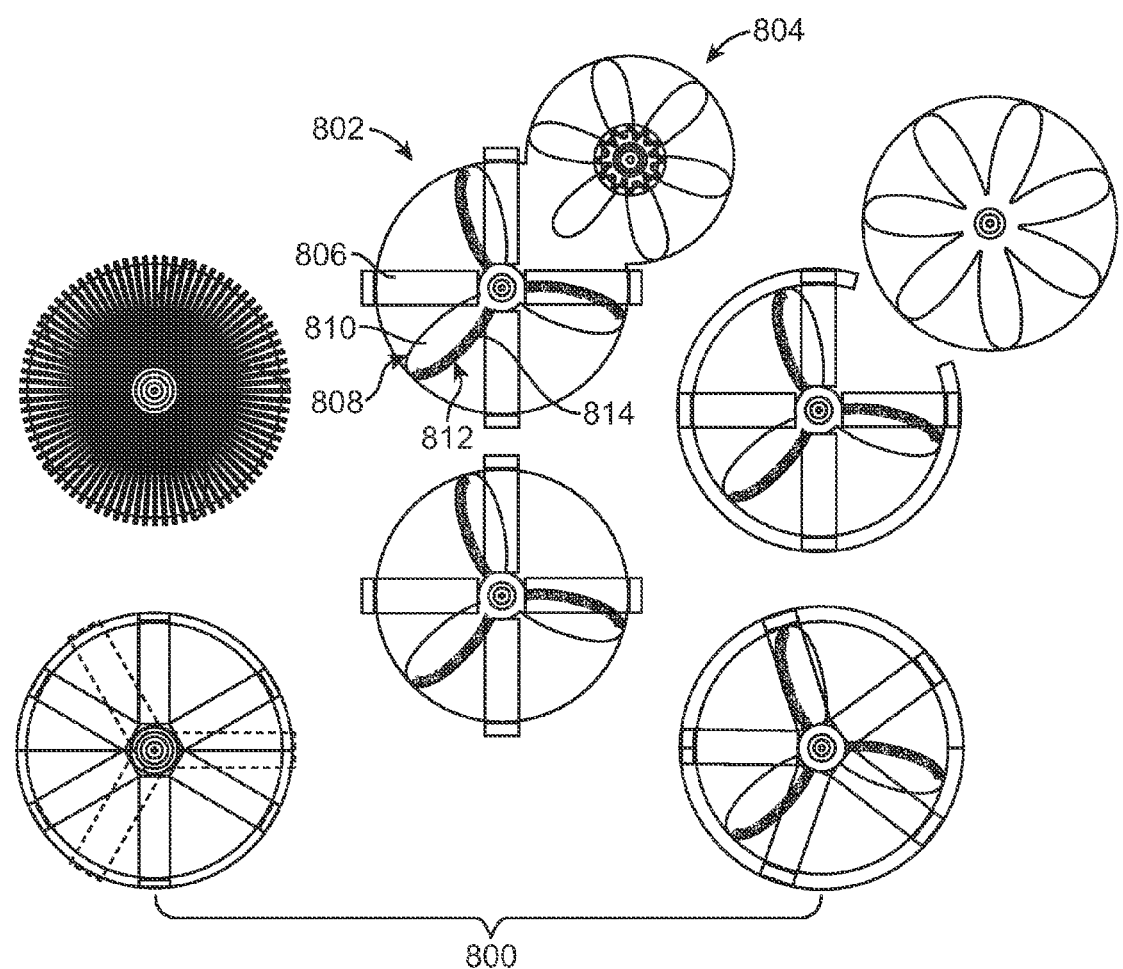
FIG. 27 is a schematic diagram of various MEMS devices utilizing the actuating mechanisms of the invention to realize rotational motions.

Actuation mechanisms in accordance to embodiments of the invention can be utilized to realize rotational motions directly. FIG. 27 is a schematic diagram of various MEMS devices 800 to realize rotational motions. For example, MEMS device 802 comprises a plurality of frame members 806, as shown forming a "cross," and a plurality of blades 808. Porous structures 814 may be formed on trailing or leading edges 810, 812 to increase the surface area of at least a portion of blades 808 thereby modifying electrical charge distributions. Differential charging of frame members 806 and blades 808 can cause blades 808 to rotate relative to frame members 806. An adjacent device 804 having only blades may also be actuated by the electric field from device 802.

Figure 28:
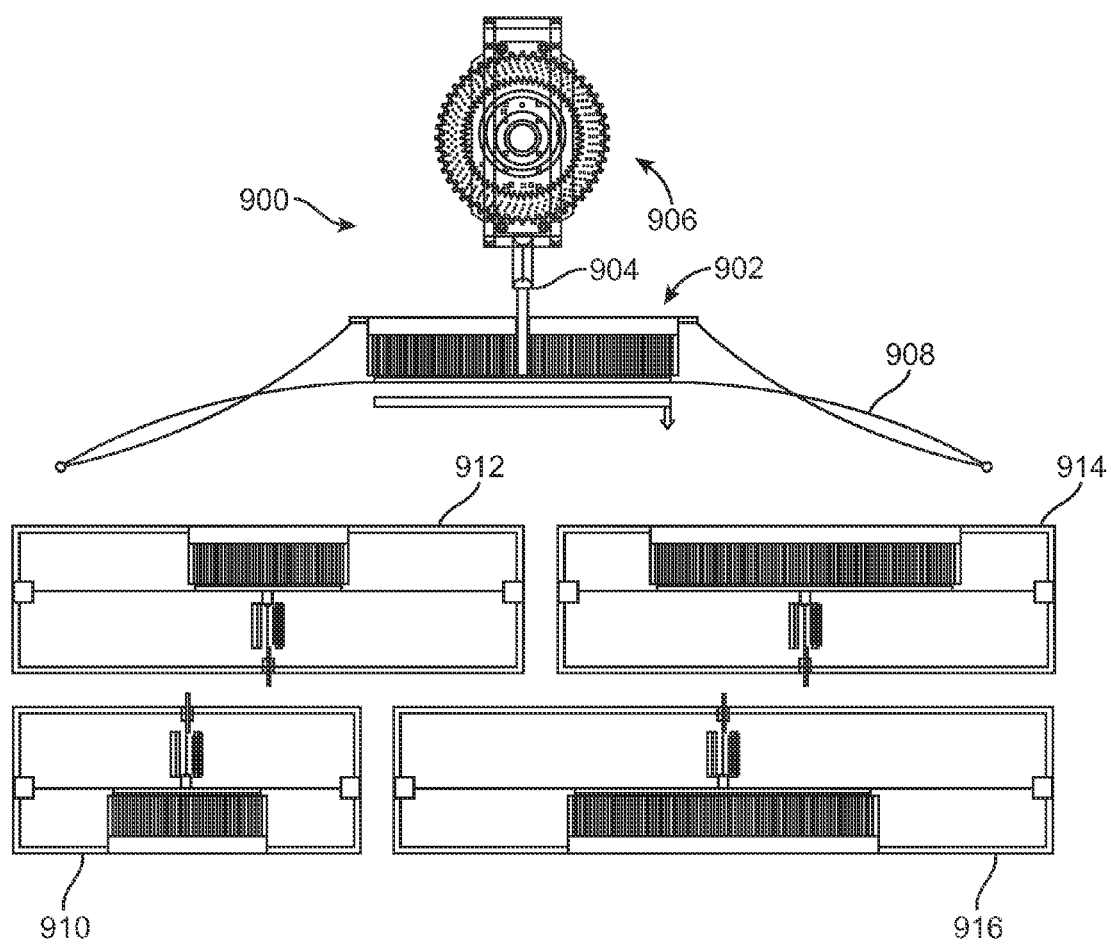
FIG. 28 is a schematic diagram of a MEMS device utilizing actuating mechanisms of the invention to translate a linear motion to a rotational motion.

FIG. 28 is an exemplary MEMS device 900 that translates a linear motion to a rotational motion. Comb drive device 902, similar to that shown in FIG. 26, is coupled to a shaft 904 that actuates a transmission 906 which realizes a rotational motion. Comb drive device 902 is biased by a spring member 908. The output linear force of a comb drive device may be calibrated using a plurality of comb drive devices 910, 912, 914, 916, each having a different number of "fingers." A relationship between the output force and the number of "fingers" or other characteristics can thus be derived.

Figure 29:
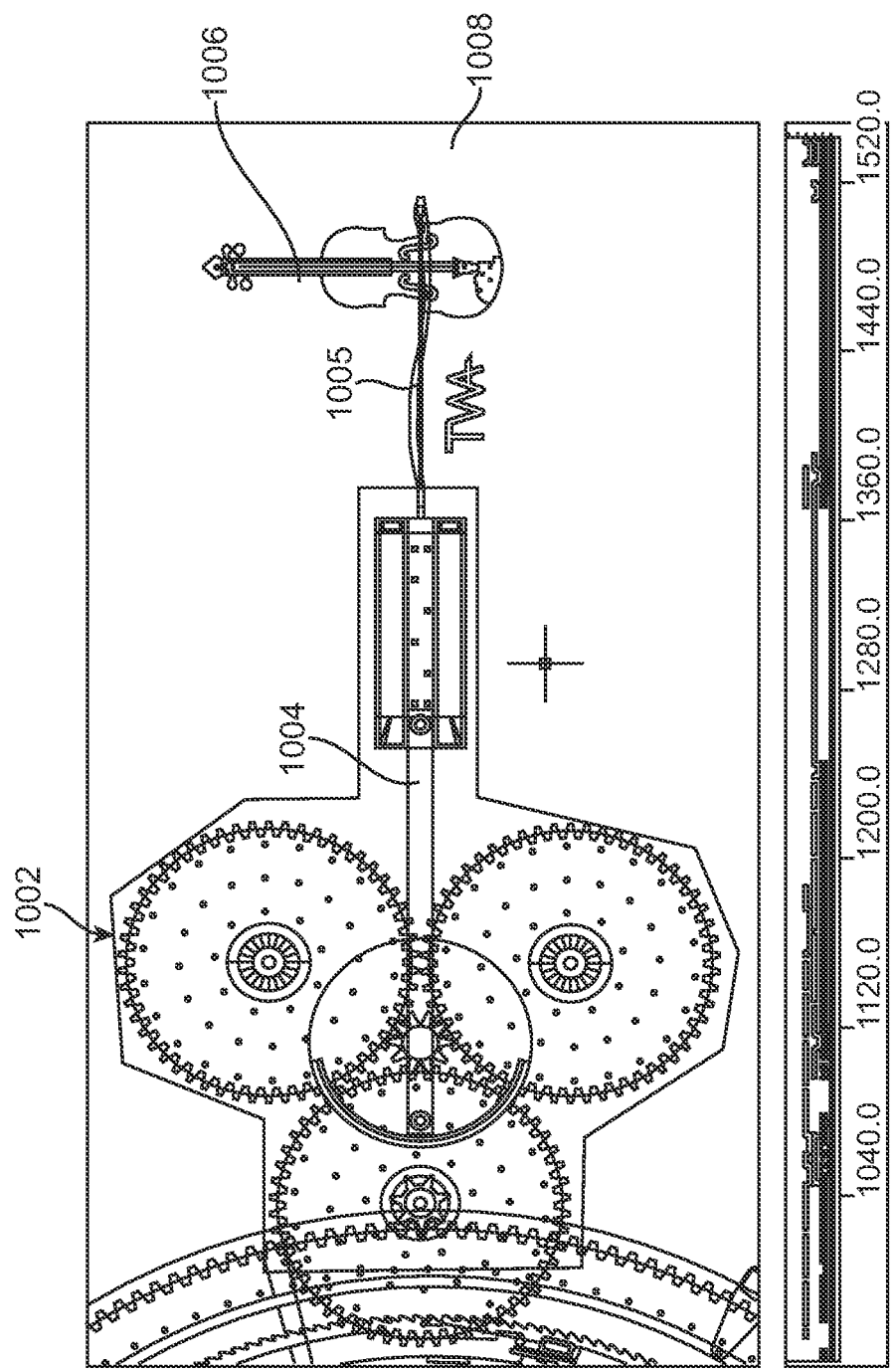
FIG. 29 is a schematic diagram of a MEMS device for translating a rotational motion to a linear motion.

FIG. 29 further illustrates a MEMS device 1000 for translating a rotational motion to a linear motion. A transmission 1002 is used to translate the rotational motion to a linear motion of a crank shaft 1004, which in turn drives the stick 1005 of a violin 1006. These elements are disposed on a substrate 1008.

Advantageously, embodiments of the invention provide a non-contact and non-intrusive method of actuating MEMS devices. High displacement, in-plane (rotational and linear) and out-of-plane motions can be realized using one or both of attraction- or repulsion-driven electrostatic drives, through charge pumping. In the case when an electron beam from an SEM is used for charge pumping, visualization of MEMS device operation can be achieved at the same time of operating such devices thereby providing an in situ examination for the designs.

In embodiments described herein, the mere act of viewing the device in an SEM, for example, at an appropriate accelerating voltage and optionally in a vacuum environment, is sufficient to actuate the MEMS devices. This results from charging elements of the MEMS devices using the SEM beam itself. Elements of the MEMS devices may be charged to thousands of volts by the SEM beam. Thus, the MEMS devices may be actuated "remotely," at the same time of ensuring visually (in real-time) that the desired effect has been achieved.

In one exemplary application, a device is disposed in an SEM, and an actuator of the device is engaged to release a specific latch or mechanism, enabling protection of the device until the right vacuum or sample conditions are achieved. In another example, a switch or a lockable latch is engaged such that a mere act of observing the device using the SEM would trigger the setting of a physical "flag" that this device has been "read" or accessed. Without such actuating mechanisms, the usually nondestructive SEM does not leave traces.

A further example of the benefit of using SEM-powered actuation is that it provides means to evaluate prototype MEMS designs in situ, thereby helping understanding optimal design parameters. When such prototypes are designed using a SEM-driven actuator instead of conventional actuators, not only the potential problems of designs are confined to the motion, the designer also has the advantage of demonstrating smooth motions using the actuator that not only actuates but also enables real-time observation, even from a tilted-stage perspective.

Those of ordinary skill in the art will recognize that known fabrication processes, including standard integrated circuit (IC) fabrication processes, can also be used to fabricate MEMS devices of the invention. An exemplary process for fabricating the devices in accordance with embodiments of the invention uses chemical deposition, photolithographic patterning, and both dry and wet etching to create MEMS devices.

Although the energy field used to actuate the MEMS devices in accordance with embodiments of the invention is described above using an SEM electron beam as an example, those of ordinary skill in the art will recognize that other types and shapes of energy field can be utilized in actuating MEMS devices. For example, an electron flood gun, which "illuminates" a large area of a chip with electrons instead of a relatively narrow beam from an SEM, may be used to activate an array of devices collectively, either in chip form or in wafer form.

While the invention has been described with respect to a limited number of embodiments, those skilled in the art, having benefit of this disclosure, will appreciate that other embodiments can be devised and achieved which do not depart from the scope of the invention as disclosed herein. Accordingly, the scope of the invention should be limited only by the attached claims.

What is claimed is:

1. A microelectromechanical system (MEMS) device, comprising:
   an actuator comprising a plurality of charge collection elements, wherein at least one of the charge collection elements is configured to build up electrical charges by directly interacting with an energy field thereby actuating the MEMS device through Coulombic interactions; and
   a substrate, wherein first and second charge collection elements of the plurality of charge collection elements are electrically isolated from the substrate, and wherein the second charge collection element acts as a secondary-electron emitter.

2. The MEMS device of claim 1, wherein the energy field interacts with the actuator through free space propagation.

3. The MEMS device of claim 1, wherein the energy field comprises at least one of an electron beam, a laser beam, a radiation beam, a charged particle beam, an uncharged particle beam, a photon beam, a static charge from triboelectric effect, and a discharge of a capacitor.

4. The MEMS device of claim 3, wherein the energy field comprises an electron beam from a scanning electron microscope (SEM), and wherein the electron beam causes electrical charges to build up on the at least one charge collection element.

5. The MEMS device of claim 1, wherein the first and the second of the plurality of charge collection elements are configured to have repulsive Coulombic interactions therebetween when interacting with the energy field.

6. The MEMS device of claim 5, wherein the actuator further comprises a third charge collection element configured to have attractive Coulombic interactions with at least one of the first and the second charge collection elements.

7. The MEMS device of claim 1, wherein the second charge collection element is configured to charge positively when interacting with the energy field.

8. The MEMS device of claim 7, wherein the second charge collection element has at least one of a dimension, a density, a coating, and a topography selected such that a relative excess of secondary electrons is produced relative to an electrical node.

9. The MEMS device of claim 8, wherein the first charge collection element is also a secondary-electron emitter such that the first charge collection element and the second charge collection element have repulsive Coulombic interactions therebetween when subject to the energy field.

10. The MEMS device of claim 9, wherein the first and second charge collection elements have a common electrical node.

11. The MEMS device of claim 9, further comprising a third charge collection element configured to have attractive Coulombic interactions with at least one of the first and second charge collection elements.

12. The MEMS device of claim 8, wherein the first charge collection element has at least one of a dimension, a density, a coating, and a topography selected such that a relative excess of secondary electrons is produced relative to an electrical node, and the first charge collection element acts as a primary electron trap such that the first and the second charge collection elements have attractive Coulombic interactions therebetween when subject to the energy field.

13. The MEMS device of claim 1, wherein the actuator further comprises a spring configured to provide a biasing or restoring force when at least one of the charge collection elements is grounded or shorted.

14. The MEMS device of claim 1, wherein at least two of the plurality of charge collection members have comb structures configured to increase an area of the Coulombic interactions therebetween.

15. An actuator for a microelectromechanical system (MEMS) device, comprising:
    a plurality of charge collection elements configured to actuate the MEMS device through Coulombic interactions by pumping charges to the actuator when subject to an energy field; and
    a substrate, wherein first and second charge collection elements of the plurality of charge collection elements are electrically isolated from the substrate, and wherein the second charge collection element acts as a secondary-electron emitter.

16. The actuator of claim 15, wherein the energy field comprises an electron beam.

17. The actuator of claim 15, wherein the Coulombic interactions comprise at least one of a repulsive interaction and an attractive interaction.

18. A method of actuating a microelectromechanical system (MEMS) device, comprising:
    irradiating an actuator of the MEMS device with an energy field thereby building up electrical charges on the actuator; and
    actuating the MEMS device with Coulomb forces from the built up electrical charges, wherein first and second charge collection elements of the actuator are electrically isolated from a substrate of the actuator, and wherein the second charge collection element acts as a secondary-electron emitter.

19. The method of claim 18, wherein the energy field is irradiated onto the actuator through free space propagation.

20. The method of claim 18, wherein actuating the MEMS device with Coulomb forces comprises actuating the MEMS device with a combination of repulsive and attractive Coulombic interactions.

* * * * *